US007838780B2

(12) United States Patent
Soares et al.

(10) Patent No.: US 7,838,780 B2
(45) Date of Patent: *Nov. 23, 2010

(54) SYSTEMS AND METHODS FOR SIMPLE EFFICIENT ASSEMBLY AND PACKAGING OF ELECTRONIC DEVICES

(75) Inventors: Edward R. Soares, Lompoc, CA (US); Stacey M. Bilski, Santa Barbara, CA (US); James R. Costa, Lompoc, CA (US); Ken S. Ono, Ventura, CA (US)

(73) Assignee: Superconductor Technologies, Inc., Santa Barbara, CA (US)

( * ) Notice: Subject to any disclaimer, the term of this patent is extended or adjusted under 35 U.S.C. 154(b) by 707 days.

This patent is subject to a terminal disclaimer.

(21) Appl. No.: 11/459,336

(22) Filed: Jul. 21, 2006

(65) Prior Publication Data

US 2010/0053907 A1    Mar. 4, 2010

(51) Int. Cl.
*H05K 9/00*    (2006.01)
(52) U.S. Cl. ............... 174/354; 174/377; 174/384; 361/816; 62/259.2
(58) Field of Classification Search ............... 174/350, 174/377, 384, 354; 361/816, 818; 62/259.2
See application file for complete search history.

(56) References Cited

U.S. PATENT DOCUMENTS

| | | | | |
|---|---|---|---|---|
| 5,083,929 A * | 1/1992 | Dalton | ............... | 439/98 |
| 5,208,425 A * | 5/1993 | Hasegawa et al. | ............... | 174/381 |
| 5,334,798 A * | 8/1994 | Kalis | ............... | 174/376 |
| 5,417,073 A | 5/1995 | James et al. | ............... | 62/51.1 |
| 5,856,768 A | 1/1999 | Hey-Shipton et al. | ............... | 333/99 |
| 6,141,971 A | 11/2000 | Hanes | ............... | 62/6 |
| 6,256,999 B1 | 7/2001 | Chase | ............... | 62/6 |
| 6,267,629 B1 * | 7/2001 | Nguyen et al. | ............... | 439/857 |
| 6,499,304 B2 | 12/2002 | Chase et al. | ............... | 62/6 |
| 6,590,471 B1 | 7/2003 | Scharen et al. | ............... | 333/99 |
| 2003/0062177 A1 * | 4/2003 | Yagi et al. | ............... | 174/35 C |
| 2006/0262512 A1 * | 11/2006 | Klein et al. | ............... | 361/800 |
| 2009/0180255 A1 * | 7/2009 | Soares et al. | ............... | 361/699 |

OTHER PUBLICATIONS

Soares et al; "HTS AMPS-A and AMPS-B Filters for Cellular Receive Base Stations," Sep. 1998, Superconductor Technologies Inc., manuscript copy, 4 pages.

* cited by examiner

*Primary Examiner*—Hung V Ngo
(74) *Attorney, Agent, or Firm*—Wolff Law Offices, PLLC; Kevin Alan Wolff

(57) ABSTRACT

Systems and methods for simple, efficient and/or cost effective manufacturing and assembly of electronic devices are provided. The various systems and methods of the invention may include various ways of coupling, attaching, and/or connecting the various components of the system to one another, for improved cost and ease of assembly. A number of clips may be used to attach together various parts of an electronic system and housing including circuit devices, enclosure lid and housing, and/or cabling. These clips may be screw-less, may be made of a resilient or spring material, designed so that they quickly snap into place so as to provide good mechanical strength and electrical connection. Various circuit elements may include planar circuits, and may include filters made of a high temperature superconductor material. A planar cable may be used for electrical connecting of components. These systems and devices may be used in, for example, wireless communication systems.

26 Claims, 27 Drawing Sheets

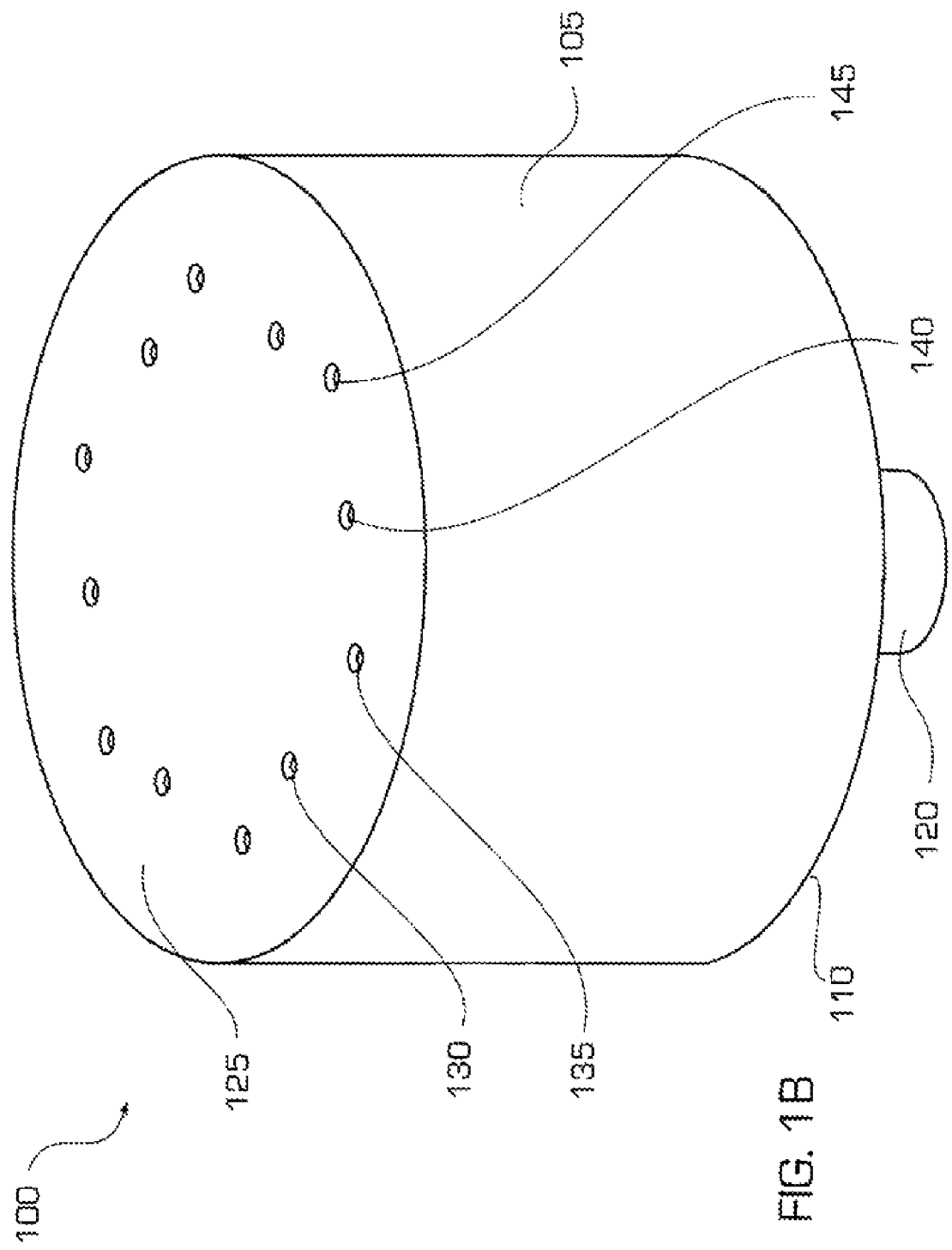

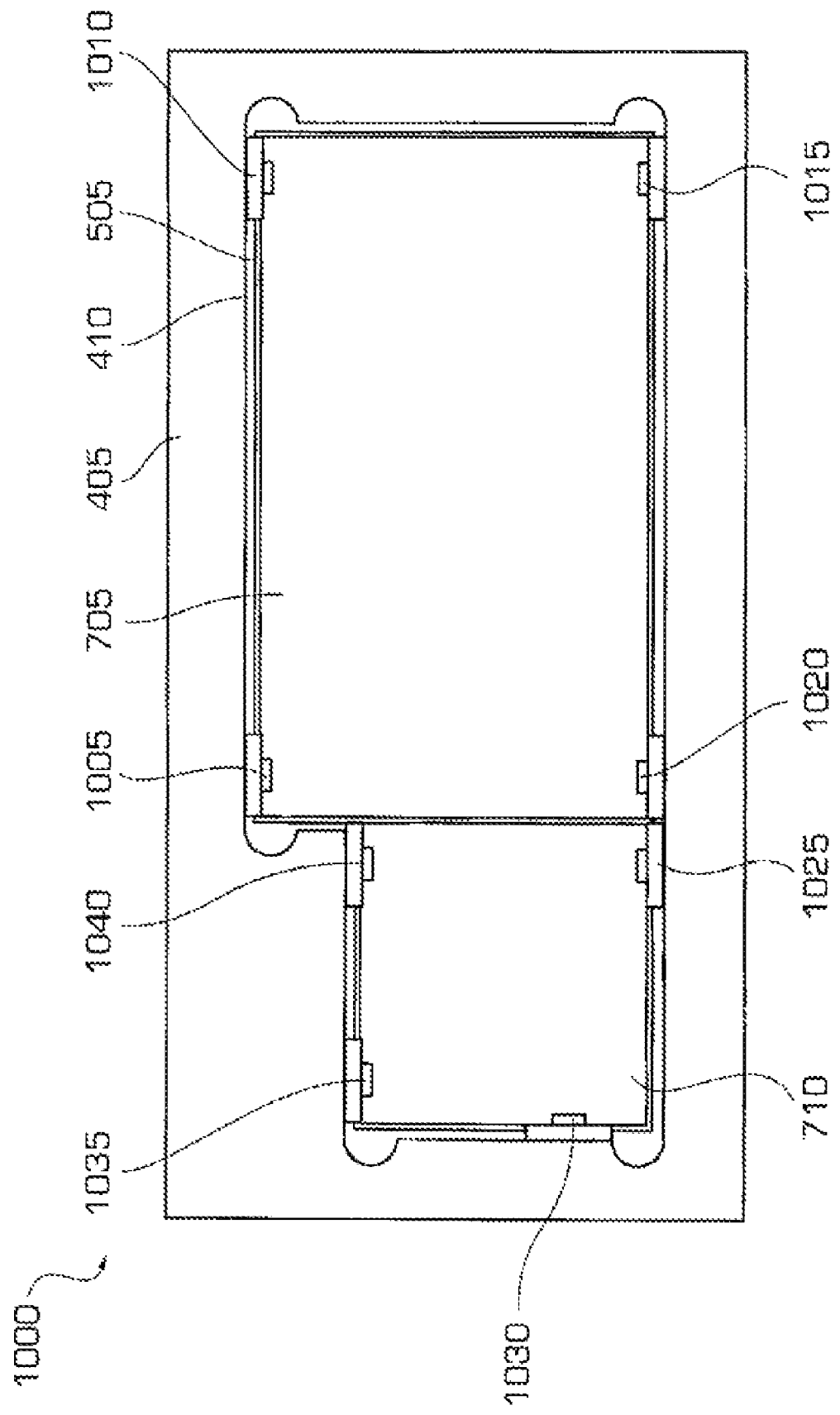

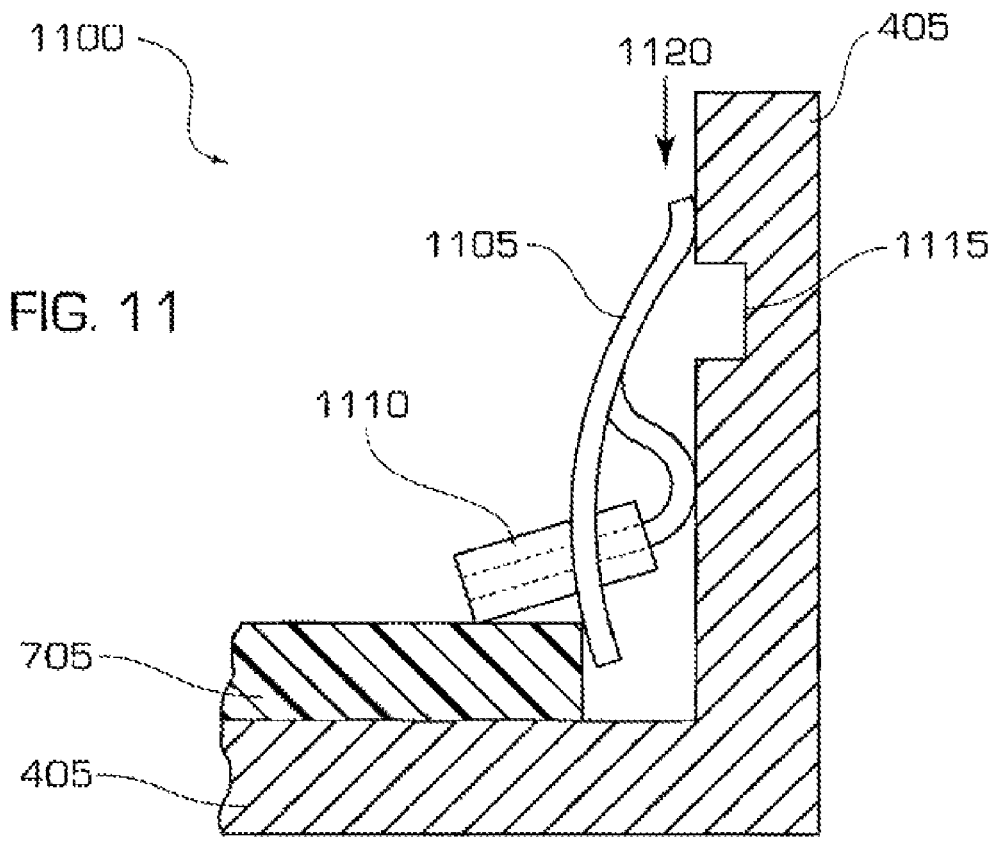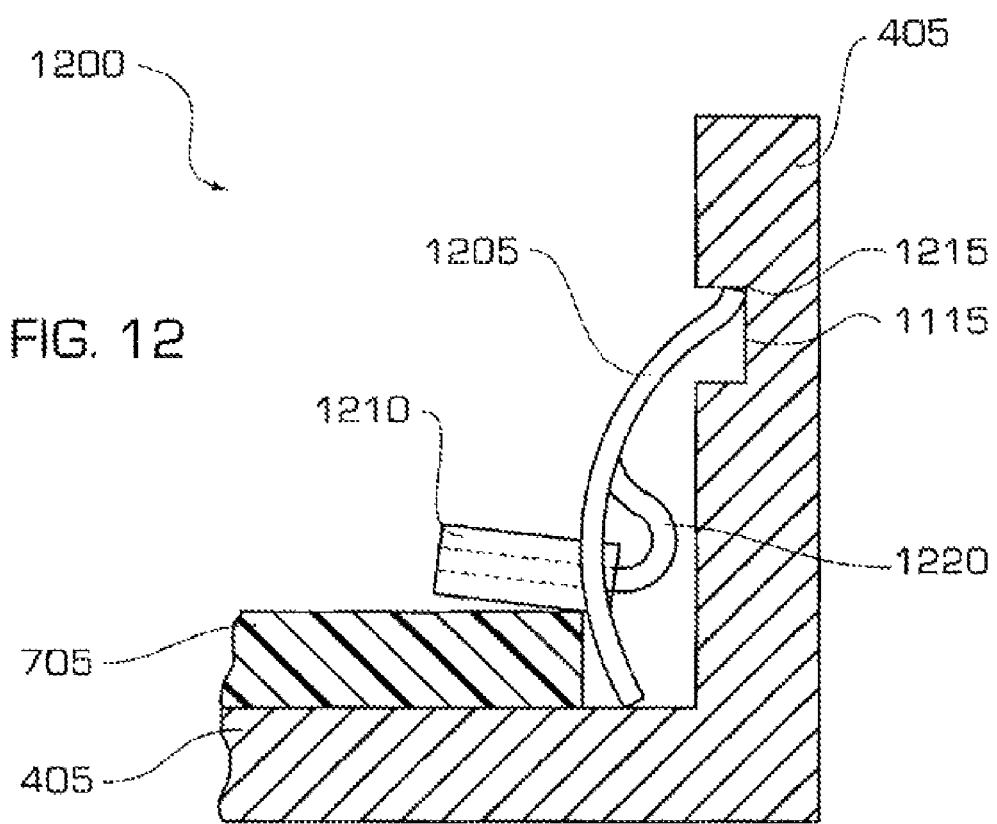

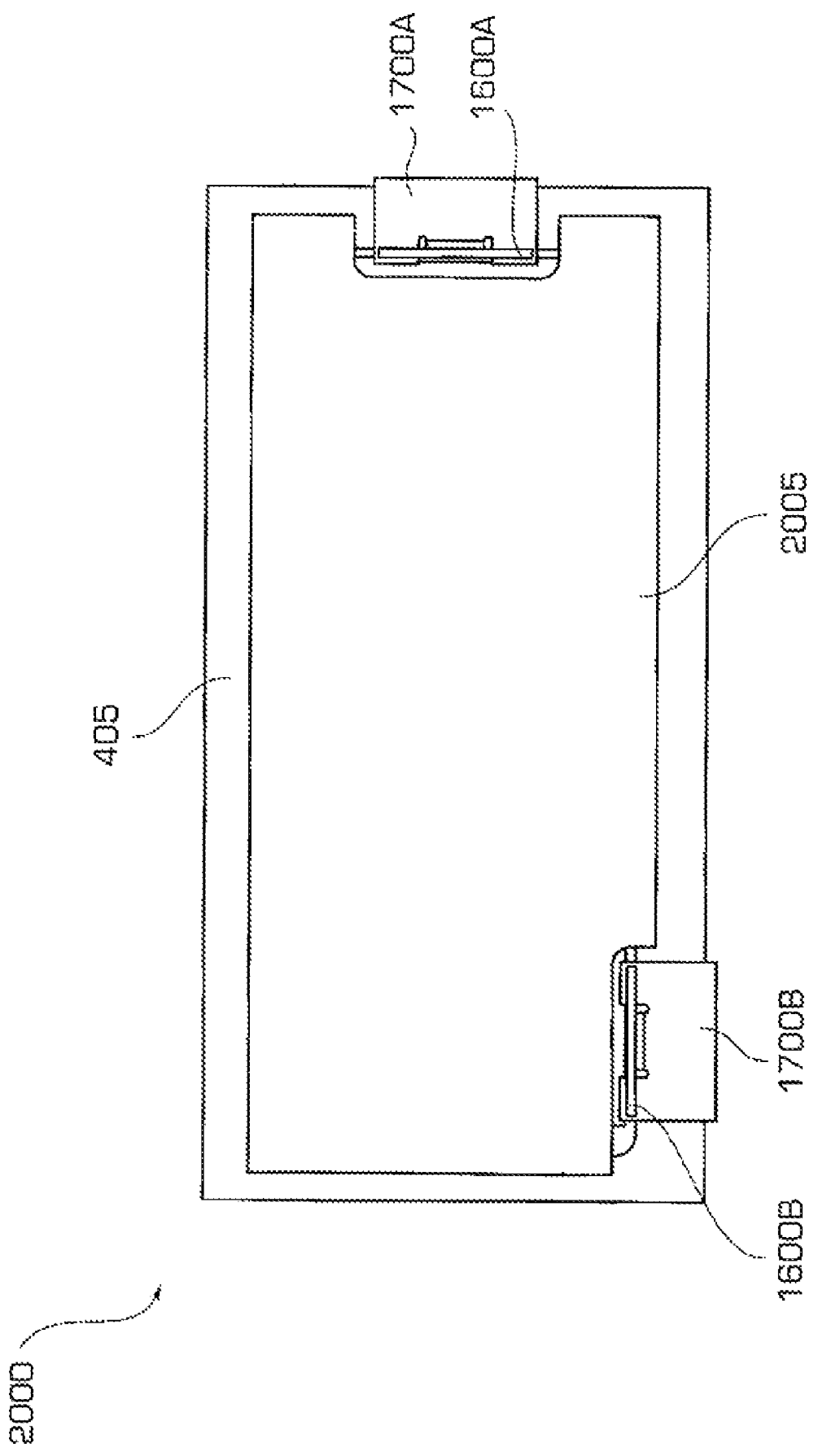

SYSTEMS AND METHODS FOR SIMPLE EFFICIENT ASSEMBLY AND PACKAGING OF ELECTRONIC DEVICES

BACKGROUND

1. Field of the Invention

The present invention relates to the field of electronic circuits and, more specifically, to systems and methods relating to providing simple efficient cost effective assembly and packaging of electronic circuits, that may be used with, for example, cryogenically cooled electronic circuits.

2. Description of Related Art

The past few decades have seen considerable advancement in electronics and communication technologies, including wireless communications. The continued development and advancement of more highly dense integrated circuits at low cost has enabled a large range of types of electronic devices to be developed. For example, many devices have been developed that include wireless communication capabilities. Mobile devices having wireless capability include, for example, mobile telephones, personal digital assistants (PDAs), laptop computers, global position sensor (GPS) devices, etc. Many of these devices operate in the radio frequency (RF) and microwave wireless signal frequency ranges.

Further, many of the electronic devices built today include integrated circuits or chips (typically planar devices such as semiconductor or superconductor chips) that often require assembly into packages. High production volume motivates improved efficiency in the speed of assembly of the electronic circuits onto circuit boards, into packages, and/or into housings, so as to improve ease of assembly and reduced complexity and cost. However, this must be achieved without generally degrading the electric performance, physical characteristics, and/or thermal characteristics of the devices. Some electronic circuits operate at high speeds and draw significant current that translates into heat. Some of the electronic devices may be operated at extremely low temperatures, such as superconductor electronic components. In either case, the electronic devices may need to be mounted on a heat sink so that the operating temperature of the electronic devices may be effectively maintained in a desired range for proper electrical operation. This heat sink may be an integral part of the housing and upon which the electronic devices may be mounted. In addition, the connection between the planar devices, e.g., integrated circuit and heat sink, may also operate as an electrical ground. Therefore, efficient coupling or connecting of these electronic devices to the heat sink can be important to achieving the desired operating temperature and electrical performance of the devices so as to obtain proper continuous operation of the electronic device.

The electronics for communicating at high frequencies, for example, RF and microwave frequency, requires transmitters and receivers that may include electric signal filters, low noise amplifiers (LNAs), and connectors and/or cabling that may be susceptible to malfunction due to noise interference and/or poor connections. For some RF and microwave applications, such as in cellular telephone base station receivers and transmitters, high performance planar filters, for example high temperature superconductor filters (HTS), have been developed to provide extremely accurate filtering to improve the quality of wireless communications, particularly in areas having a high density of wireless devices or where the RF or microwave signals may not propagate well. In the case of superconductor electronic devices, the electronic components will be operated at very cold temperatures, and the electronic devices such as the signal filters and/or LNA may be contained in a housing or dewar, and electrically coupled to the rest of the electronic devices via connection cables. (See, for example, U.S. Pat. No. 6,499,304, that is hereby incorporated herein by reference.) The connection cables will need to have low electrical loss (good conductivity and connections), high thermal resistance, and good isolation for proper operation of the filter and/or amplifier. In case of HTS applications the connection cable(s) may be referred to as cryocable(s).

Further, the number of parts and complexity of assembly may be great due to the various requirements of the electronic system. For example, numerous screws and taped holes may be included to attach the various electronic components to one or more housings.

Some exemplary cryogenically cooled HTS filter and LNA systems used in telecommunications are shown and described in U.S. Pat. Nos. 5,488,382 and 6,662,029, which are hereby incorporated herein by reference.

The present invention provided below includes a number of approaches to designing the packaging and interconnecting of electronic circuits for a more efficient and cost effective system and method of manufacturing electronic circuit assemblies. These approaches may be particularly beneficial in cryo-cooled HTS systems for use in RF and microwave applications, such as wireless communications.

SUMMARY

The present invention is directed generally to providing methods, systems and apparatus for simple, efficient and/or cost effective manufacturing and assembly of electronic devices. The various systems and methods of the invention may include various ways of coupling, attaching, and/or connecting the various components of the system to one another. Various components may also be designed for improved cost and ease of assembly. For example, a number of screw-less clips such as spring clips may be used to attach together various parts of an electronic system and housing. Further, circuit elements may include planar circuits and the planar filters, or other components, which may be made of a high temperature superconductor material (HTS). In various embodiments, these systems and devices may be used in, for example, wireless communication systems.

More specifically, embodiments may include simple efficient cost effective assembly and packaging of electronic circuits, such as a radios frequency (RF) circuit(s), that may be, for example, cryogenically cooled electronic circuit(s). Such embodiments may include, for example, one or more means for coupling or attaching one or more portions of an electronic system together with quickness and ease. For example, one or more screw-less clips may be used to couple an electronic device to a housing, a lid onto a housing, and/or a cable onto an electronic device and/or housing, and/or a cable onto a through electrode or post. These clips may be spring type clips that may snap quickly into place and/or slide easily onto a mating structure. The system may also include cables that are quick and easy to install, and which provides good conductivity and is well electrically shielded. Further, the system may include a conductive means for ensuring good conductive connection between one or more circuit devices and a housing or casing so as to provide good grounding of the electronic devices. The conductive means may also enable good flow of air from interface areas when the system is placed, at least in part, in a vacuum.

In at least one embodiment, the invention may include a screw-less clip that holds a circuit element in place in a housing. The screw-less clip may be made of a resilient material, for example a spring metal, such as BeCu or steel, and may be plated with silver or gold, that may provide tension to hold a circuit element in place. The screw-less clip may also be designed for quick and easy instillation. The circuit element may be an active or passive circuit element and may be, for example, a planar circuit element. The housing may include an RF enclosure. The screw-less clip may be designed to snap into a channel in the side of RF enclosure so as to assert force on a planar circuit element to hold it in place in the RF enclosure. Some exemplary planar circuits may include a signal filter and/or a low noise amplifier. The signal filter may be an HTS signal filter. The entire RF enclosure and/or micro-enclosure may include an HTS filter and LNA and may be placed in a dewar and cryogenically cooled by a cryogenic cooling system. A plurality of RF enclosures may be coupled together within one HTS dewar.

In at least one embodiment, the invention may include a screw-less clip that holds a lid on a housing(s). For example, the lid may be for an RF assembly, an RF enclosure, and/or a micro-enclosure. The screw-less clip may be made of a resilient material, for example a spring metal, that may provide tension to hold the lid in place. The screw-less clip may also be designed for quick and easy instillation. The clip may snap into a grove or over a bump on the housing and/or lid to secure the clip to the lid and/or housing. The housing(s) may include an RF enclosure and the lid may be used, at least in part, to electrically isolate one or more RF circuit elements within the housing. The entire RF enclosure may be for providing electronic circuits in an HTS system and may be placed in a dewar and cryogenically cooled by a cryogenic cooling system.

In at least one other embodiment, a cable is provided with a meshed ground plane. This approach will help minimize heat load while maintaining a good electrical performance, particularly when use in RF applications and in the case of cryo-cooled systems such as used for HTS. The cable may also be a dielectrically load microstrip so that an upper and lower ground plane do not have to be aligned. The cable may be designed to carry both AC (e.g., RF) and DC signals that may include a circuit bias signal, a sensor signal, and/or a communication signal. The cable may also include a shield that electrically shields the electric conductor from other electric signals. The shield may be formed from an isolating sleeve. The isolating sleeve may be metalized for good grounding and shielding properties.

The cable may easily be attached to one or more connections and may be secured using one or more screw-less clips. The cable may be, for example, a cryo-cable capable of providing interconnection between circuits that at least some are cryogenically cooled. The cable may be bonded at one end to a circuit element. An end may be secured in place by a screw-less clip so that the cable stays bonded to the circuit element. The screw-less clip may be made of a resilient material, for example a spring metal, that may provide tension to hold the cable in place. The screw-less clip may also be designed for quick and easy instillation. The screw-less clip may be designed to be partially on the inside of a housing and/or micro-enclosure and partially on an outside of a housing and/or micro-enclosure. The clip may snap into place by squeezing a side of the housing. The clip may have at least one tab that helps to support the cable. The housing may be an RF housing and/or micro-enclosure. The cable shield may be attached to the housing by the screw-less clip to form a good ground connection. An end of the cable may include another screw-less clip that may be attached to a terminal or post, for example a center pin, without the use of a typical connector. The screw-less clip may be secured to the terminal or post with another screw-less clip, for example, a spring clip. The spring clip may be attached to a casing or wall by, for example, spot welds.

In at least one other embodiment, the invention may include a means for improved ground connection and heat conduction between a circuit element and a housing. In one variation, the improved ground connection may be between the back surface of a planar circuit element (e.g., a filter element, an LNA, an integrated circuit, a hybrid circuit, etc.) and may include a wire mesh. The wire mesh may be made from, for example, a gold plated copper wire. The wire mesh may be placed between the circuit mounting surface of the housing and the back surface of the housed circuit elements. Subsequently, the circuit elements may be secured in place using as attachment means, for example a screw-less clip. The wire mesh may also allow for less rigorous flatness requirements on the housing surface where circuit elements are to be mounted. In another variation, the circuit mounting surface of the housing may be formed of a textured surface. In the case of RF circuits including HTS, the mesh and textured surface may also provide improved air evacuation when the RF housing is under a vacuum.

Still further aspects included for various embodiments are apparent to one skilled in the art based on the study of the following disclosure and the accompanying drawings thereto.

BRIEF DESCRIPTION OF THE DRAWINGS

The utility, objects, features and advantages of the invention will be readily appreciated and understood from consideration of the following detailed description of the embodiments of this invention, when taken with the accompanying drawings, in which same numbered elements are identical and:

FIGS. 1A and 1B are perspective views of a dewar assembly including an enclosure, according to at least one embodiment;

FIG. 10 is a top view of one of the micro-enclosures for housing one of more circuit elements that includes a plurality of screw-less clips to hold down a plurality of circuit elements, according to at least one embodiment;

FIG. 11 is a cross-sectional view of one of the micro-enclosures and circuit element with a side view of a screw-less clip in the non-clipped position, according to at least one embodiment;

FIG. 12 is a cross-sectional view of one of the micro-enclosures and circuit element with a side view of a screw-less clip in the clipped or snapped-in position, according to at least one embodiment;

FIG. 20 is a top view of one of the micro-enclosures for housing one of more circuit elements that includes a lid, according to at least one embodiment;

DETAILED DESCRIPTION

Figure 1A:
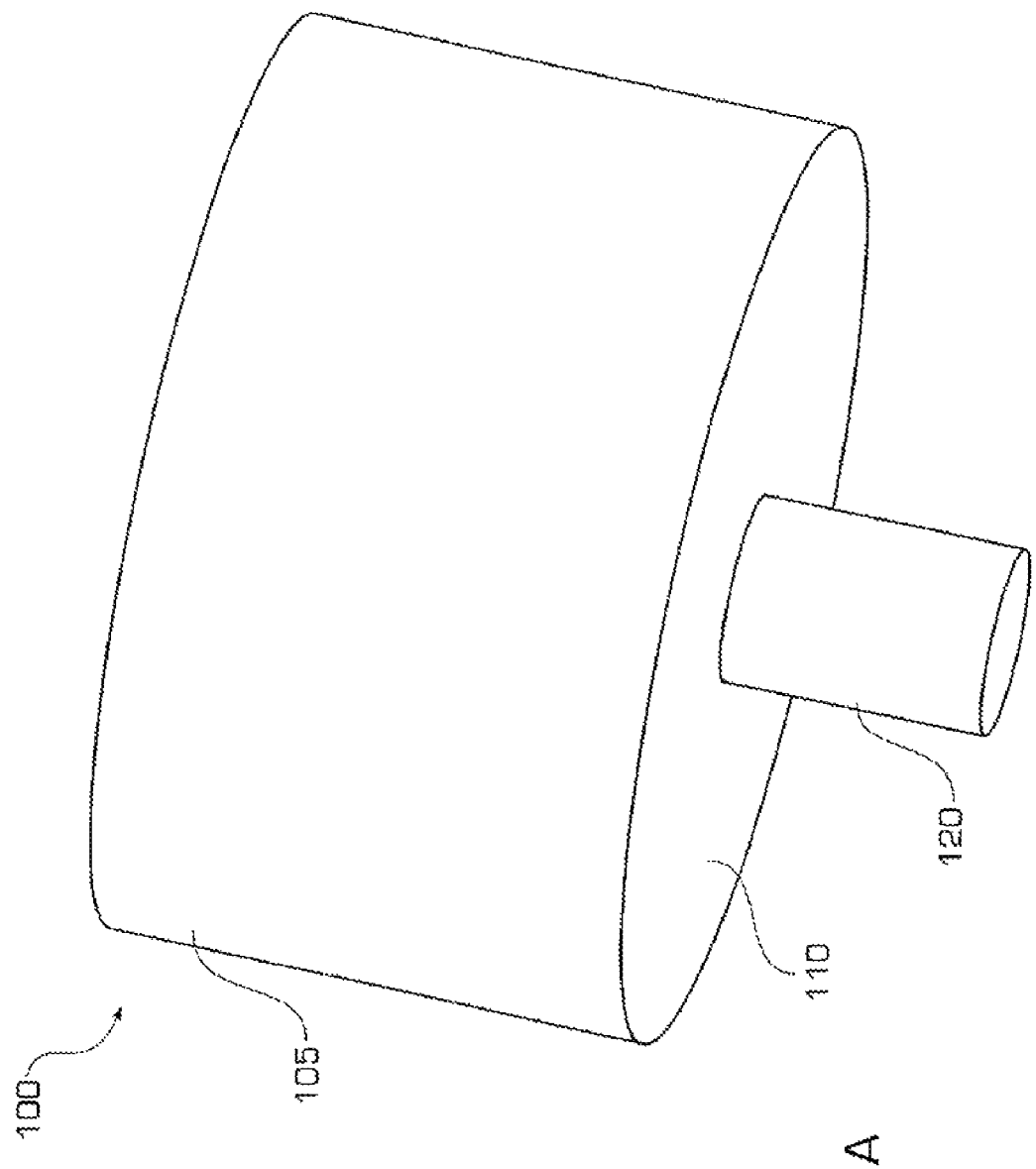

The present invention is directed to creating systems and methods for simple efficient assembly of electronic circuits into various housings and/or modules. The invention is particularly well suited for noise sensitive electronic circuits. In various embodiments the invention relates to reducing the cost of electronic systems that may include microelectronic assemblies, RF enclosures, cabling, and other parts of electronic systems that may include a housing or casing and that may need to be connected with other electronic systems. In various embodiments of the present invention, systems and methods are provided for reducing the cost of cryogenic products, for example HTS systems for wireless communications, while maintaining the quality and operational standards of the cryogenic products. A general discussion of the invention and a detailed description of some embodiment follow.

First the assembly of a micro-enclosure may be considered. The assembly may be for electronic circuits, for example, for an RF circuit and micro-enclosure. One known way to attach circuit elements to a housing or micro-enclosure involves clips that are fastened to the housing or micro-enclosure with screws. However, this approach requires many small (e.g., 0-80) taped holes in the housing that increase the cost of the system. This approach also involves a lot of labor for attaching all the screws. As an alternative, a simple clip that snaps into the housing without the need for screws (screw-less) may be used. Each individual clip may therefore be installed more quickly with less parts, thus reducing the cost of the product and assembly time. In one variation, using this approach many clips may also be attached at the same time. In this manner, using a screw-less snap in clip may have the dual effect of lowering the cost due by removing the tapped holes and lowering the labor needed to attach these screws.

Another area to consider where the cost of the system may be reduced is the connection between the subcomponents in the system. Generally, cables with connectors are used to connect various subcomponents in an electronic system. The cost drivers here may be the cable design and the connector. Presently, many cable designs in electronic systems may include connectors. The connectors may be complicated and have both metal contacts and insulating housings to hold the metal contacts. This is particularly true for cryocables designed for use with HTS in wireless communication systems. However, by introducing a spring type clip and/or welding or bonding processes, a cable without a connector may be developed to reduced cost. For example, in the case of an HTS system, clips may be used to attach a cable to the micro-enclosure and to a feed through pin in a housing (e.g., dewar) wall. At the housing wall the cable clip may grab the RF feed through pin and the other end of the cable a clip may be used that allows a ribbon weld to a substrate within the micro-enclosure (e.g., ribbon welded to a contact on an electronic device after the cable is installed). Use of the though pin may enable an electronic circuit board (e.g., an RF board) to be directly mounted on the outside of the housing wall, thus eliminating another set of one or more cables entirely.

Another area where assembly cost may be saved is in attaching a lid on the micro-enclosure. For example, in the wireless communication systems including HTS, presently, lids would typically be attached with screws and need to have a very demanding lid flatness callout in order to provide a good ground (thus requiring accurate and expensive machining of the lid). These new snap on lids may be formed from, for example, thin BeCu material. To save assembly cost and time, the lids may be secured over the electronic circuits using another type of clip that may snap into place and hold the lid firm against the micro-enclosure housing. This clip may be screw-less and made of a resilient or spring type material. This clip on lid approach may remove both an expensive machined lid and the needed for threaded hole(s).

The cost of the cables themselves may also be improved. The cables often need to have low electrical loss and may need a high thermal resistance (e.g., cryocables in HTS systems). Some examples of this type of cable has been shown and described in U.S. Pat. No. 5,856,768, titled Transition and Interconnect Structure For A Cryocable, and U.S. Pat. No. 6,590,471, titled Push On Connector For Cryocable and Mating Weldable Hermetic Feedthrough, which are hereby incorporated by reference. Typically, electronic systems require multiple cables to interconnect various electronic circuits and circuit modules. For example, one HTS filter and amplifier system may require 12 cryocables, thus providing reasonable opportunity for overall cost reduction by achieving even a small cost reduction for each cable. One improvement may be to provide a mesh for the ground plane of the cryocable. This approach may help to decrease the heat load on the heat sink and improved performance. The cable may also be formed in a micro-strip topology so as to further reduce cable cost. The micro-strip topology cable (e.g., cryocable) may include a means of improving electrical shielding and isolation by adding, for example, an isolating sleeve, that may be made of a thin flexible isolating material with a thin conductive outer layer, for example, silver or gold plated isolating sleeve, such as Mylar, around the cable to decrease any signal (e.g., RF) leakage. The isolating sleeve was may be made to include metal and may act as a thermal radiation shield. The isolating sleeve shield may be improved by adding some dielectric rings around the cable to control the distance between the isolating sleeve shield and the cable. Thus, the isolating sleeve shield became the outer conductor of the cable and also provided the needed shielding functionality. In effect, a pseudo coaxial cable may be formed more cost effectively.

Presently in some electronic systems (e.g., crycooled HTS filter and amplifier systems) separate cables would need to be provided for DC and AC signals, respectively. For example, in a cryo-cooled HTS filter and amplifier system a manganim wire may be provided from the dewar wall to the micro-enclosure. This wire may be used to bias the LNAs and get temperature sensor information. However, using the present invention, each cable (e.g., cryocable) may be multifunctional for AC and DC signals and used to carry RF signals, feed power (bias) to the LNAs, and carry temperature sensor information to control electronics. Connectors are also a cost driver. As noted above, by using a clip technology rather than connectors on the cables, a new way has been developed to directly attach the cable(s) to a feed thru pin in the housing (e.g., dewar) wall. This not only eliminates the connector structure but also improves overall performance of the cable(s). Although, a means such as bias-Ts may be required on the LNA in order to break out the non-RF signals from the RF signals.

A further area for cost reduction may be found in the other components within the housing, e.g., within the dewar. For example, a means for reducing the amount of machining needed to make a micro-enclosure may prove cost effective. In one embodiment, a plated wire mesh may be used under the electronic devices or circuits. This may, for example, allow the use of a less demanding surface finish on the micro-enclosure and still maintain a good ground path. The use of mesh may also be particularly helpful in a vacuum environment, for example with a cryo-cooled HTS filter and/or LNA packaged in a dewar and used in wireless networks, in order to avoid trapped air pockets.

Referring to FIGS. 1A and 1B, an exemplary electronic system is provided to better explain the invention of the subject application. FIG. 1A shows a perspective view of a housing or dewar assembly 100 including an enclosure 105, as viewed from the lower left side. This dewar assembly 100 may be included within, for example, an HTS filter and/or amplifier unit in a base station of a wireless communication system. An exemplary, HTS filter and/or amplifier unit may be as described in U.S. Pat. No. 6,499,304 which is entitled "Cryocooler For HTSC Filter Systems" and is hereby incorporated by reference. The dewar assembly 100 may include a bottom wall 110. The bottom wall 110 of the dewar assembly may have a cooling port 120 attached to it for cooling the electronics within the dewar 100. In the case of using HTS electronic devices with the dewar 100, the cooling port 120 may be used for reducing the electronic devices to a low temperature of, for example, approximately 77K for proper operation. Some exemplary cryogenic cooling system may be found in U.S. Pat. No. 6,499,304 which is entitled "Cryocooler For HTSC Filter Systems" and in U.S. Pat. No. 5,417,073 entitled "Cryogenic Cooling System", which are hereby incorporated by reference. The dewar assembly 100 may be an enclosure or enclosure housing that is, for example, a canister shape having a casing wall 105, and be capped on either end by the top wall 125 (see FIG. 1B) and the bottom wall 110. FIG. 1B shows a perspective view of the dewar assembly 100 viewed from the top left side. The dewar assembly 100 top wall 125 may have one or more through holes, for example, holes 130, 135, 140 and 145 used to electrically connect the electronic devices within the dewar 100 to other circuits such as a receiver or transmitter. The through holes 130, 135, 140 and 145 may include through posts or conductors (not shown) that go through, and are insulated from, the top wall 125 of the dewar 100.

Figure 2:
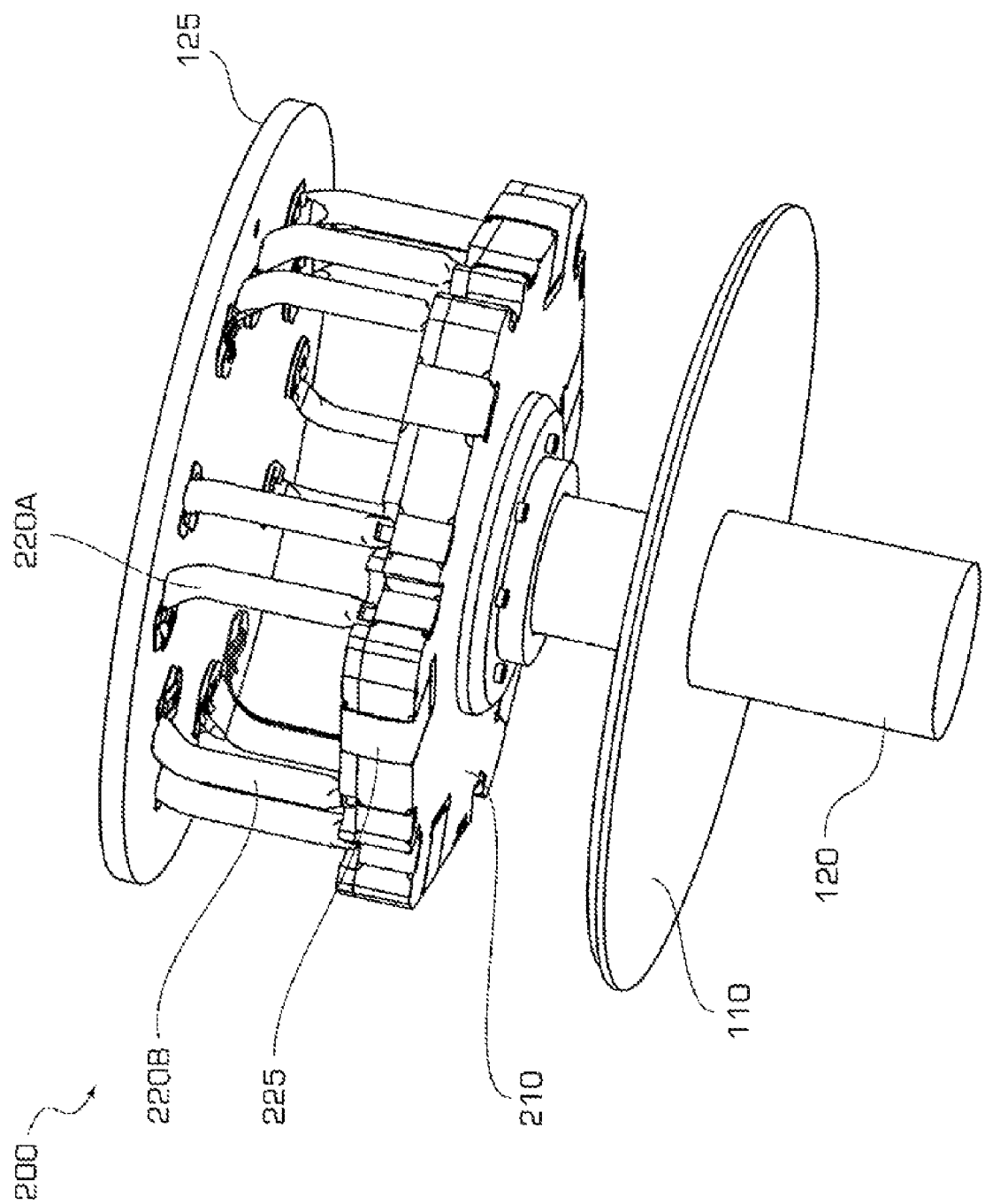
FIG. 2 is a perspective view of various components including electronic RF housing and cryocables that may be found in the dewar assembly with the enclosure, according to at least one embodiment.

Referring now to FIG. 2, a perspective view 200 of various components of the dewar 100 according to one embodiment is provided. In this embodiment, the cylindrical casing wall 105 (i.e., the sides of the canister) of the dewar housing 100 is removed exposing the top wall 125, an electronic device housing and heat-sink 210, the bottom wall 110, a plurality of cables (e.g. 220A and 220B), and the cooling port 120 of the dewar assembly 100. The device housing may include a plurality of micro-enclosures housings (e.g., 225) that may house one or more electronic devices, e.g., a HTS filter and/or an LNA. Each of these 6 devices in the enclosure may have a different function. For example, each filter and LNA could cover a different frequency. The electronic device housing and heat-sink 210 may act as a heat-sink or thermal conductor for the micro-enclosure(s) (e.g., 225) and may be coupled to the cooling port 120. As such, the present invention has the micro-enclosure designed into the heat-sink or thermal conductor. An alternative approach to designing the heat-sink may be found in U.S. Pat. No. 6,256,999, which is incorporated herein by reference. So, it is possible to design the micro-enclosure and the heat-sink as separate parts and attaching them together. However, the single piece or integral heat-sink and micro-enclosure approach of the present invention helps to reduce the number of components and reduce assembly time and cost. In any case, the electronic device housing and heat-sink 210 may be connected or mounted on its bottom to the cooling port 120 using, for example, a mounting bracket and screws. The cables 220A and 220B may be, for example, cryocables that are coupled between the electronic devices in the micro-enclosure 225 and a through pin (not shown) that enables the cables 220A and 220B to be connected to electronic device(s) outside the dewar walls. For example, the through pins may be coupled to an electronic circuit board outside the dewar, to another cable, or to a terminal post. In this embodiment there are two cryocables 220A and 200B coupled to electronic device(s) in each micro-enclosure housing 225. In the embodiment shown, there are six micro-enclosures (e.g., 225) formed in the electronic device housing 210 and 12 cryocables (e.g., 220A and 220B). Of course, there could be fewer or more micro-enclosures in each dewar 100 and on a single electronic device housing 210. Further, more than one electronic device housing may be included in a single dewar 100 and not all micro-enclosures, electronic devices and/or cables need to serve the same function. For example, in various embodiments each micro-enclosure and associated electronics and cables, or a pair of them, my be directed to a separate channel in a wireless communications system.

Figure 3:
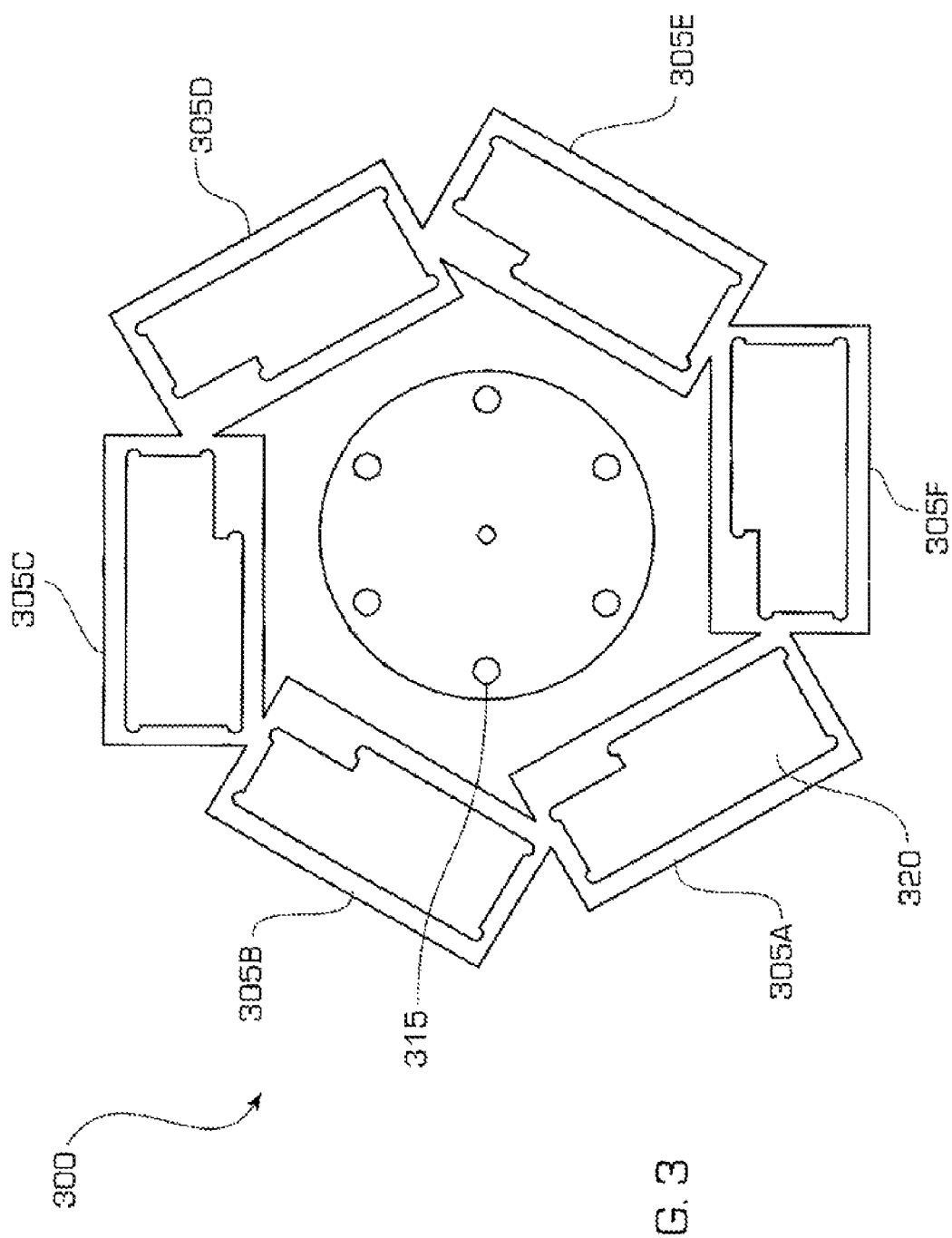
FIG. 3 is a top view of a housing ring having six micro-enclosures formed around its periphery, according to at least one embodiment.

Referring now to FIG. 3, a top view 300 of the electronic device housing and heat-sink 210 according to one embodiment is provided. As shown by this view, the housing and heat sink 210 may be formed in the shape of a ring and may have six micro-enclosures 305A-305F formed around its periphery. The entire bottom of the electronic device housing 210 may be a contiguous plane of material. In this way, the ring of micro-enclosures 305A-305F may be held firmly together so as to give the electronic device housing and heat-sink better strength and heat dissipation properties. The center section may include a plurality of mounting holes 315 for attaching the electronic device housing and heat-sink to the cooling port 120. Each micro-enclosure area 305A-305F may have a well area or basin 320 into which electronic devices (not shown) may be placed. The electronic device housing 210 may be made of a material that has good heat and electric conduction characteristics, such as a metal including aluminum or copper that may be plated with silver or gold. Further, the electronic device housing 210 may be formed by, for example casting or molding and machining various surfaces to meet dimension requirements.

Figure 4:
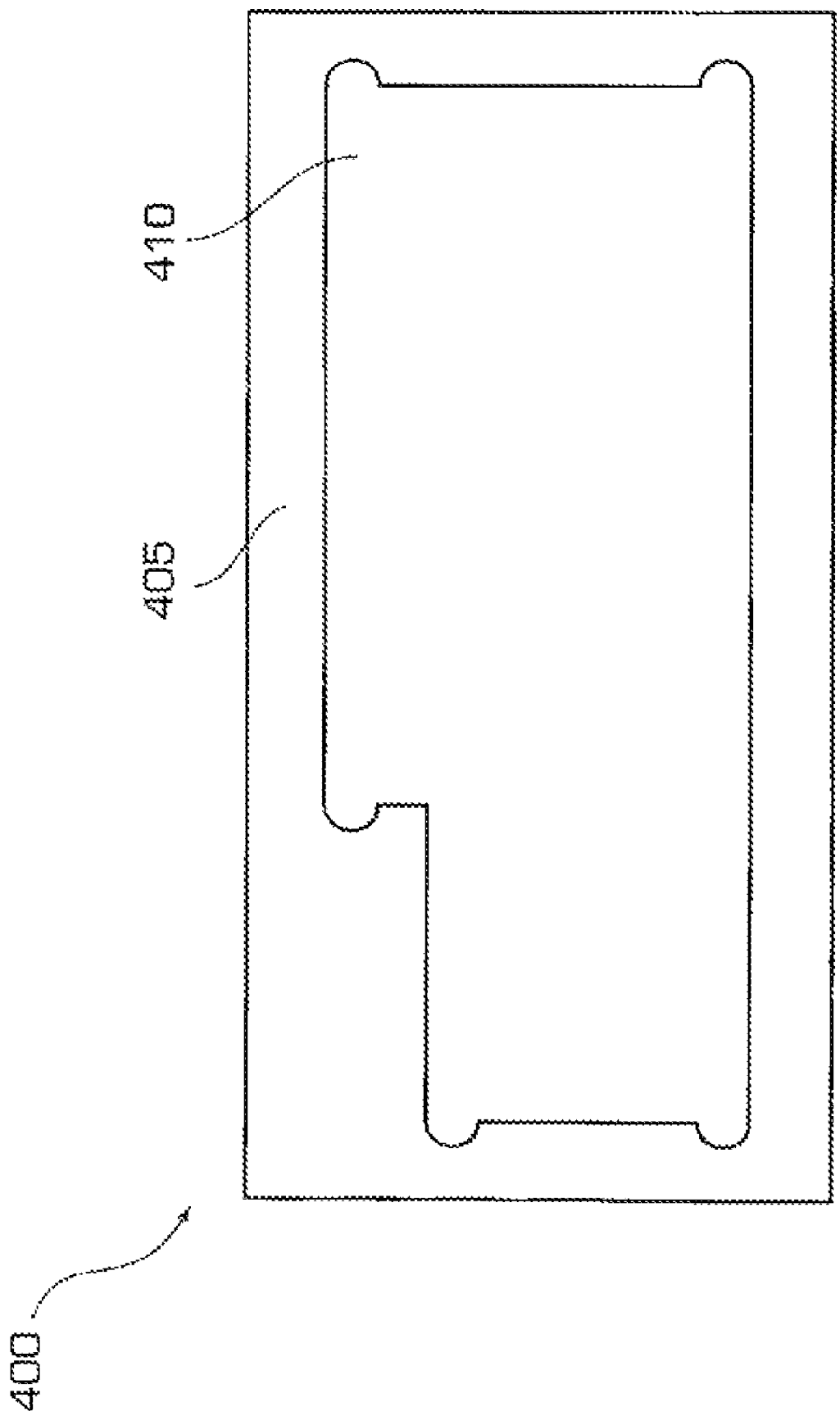
FIG. 4 is a top view of one of the micro-enclosures for housing one of more circuit elements, according to at least one embodiment.

A description will now be provided explaining how various components are provided with the micro-enclosure (e.g., 305A) so as to form an electronics subassembly. Referring to FIG. 4, a top view 400 of a portion of one of the micro-enclosures (e.g., 305A) is shown. Note that the drawing is simplified for convenience of discussion by extracting the micro-enclosure 305 from its orientation within the electronic device housing and heat sink 210, and showing squared sides. In this illustration, the walls 405 of the micro-enclosure 305 surround an electronic device mounting area 410. The mounting surface of the electronic device mounting area 410 (bottom surface or the well) may a machined surface sufficiently flat and/or textured to mount planar circuit devices. The bottom surface may be made to quickly conduct heat and allow air to escape from below electronic devices secured in the well.

Figure 5:
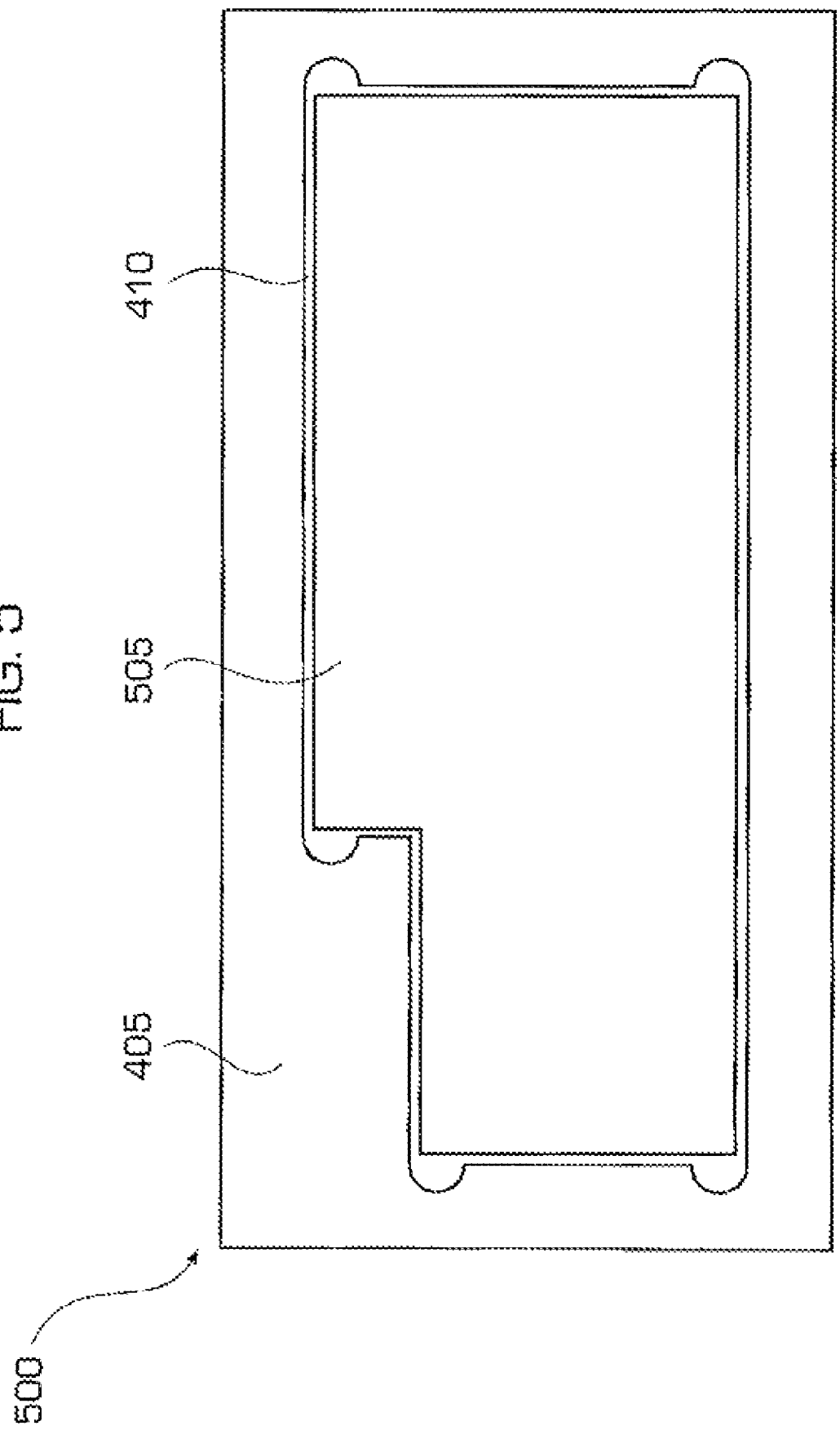
FIG. 5 is a top view of one of the micro-enclosures for housing one of more circuit elements and including a means for improving thermal and electrical characteristics, according to at least one embodiment.

Referring now to FIG. 5, a top view of one of the micro-enclosures 305 shows the introduction of a means for improving thermal and electrical characteristics 505, according to at least one embodiment. As mentioned above, the bottom or floor 410 of the well in the micro-enclosure 305 may include textured or treated surface so as to improve the electrical and thermal conduction of the micro-enclosure 305. The larger the texture on the surface, the better the air may escape from between a circuit element and the bottom surface of the well. Of course, the larger the texture, the less electrical and heat conduction the surface will likely provide. Another means is shown in FIG. 6, as described below.

Figure 6:
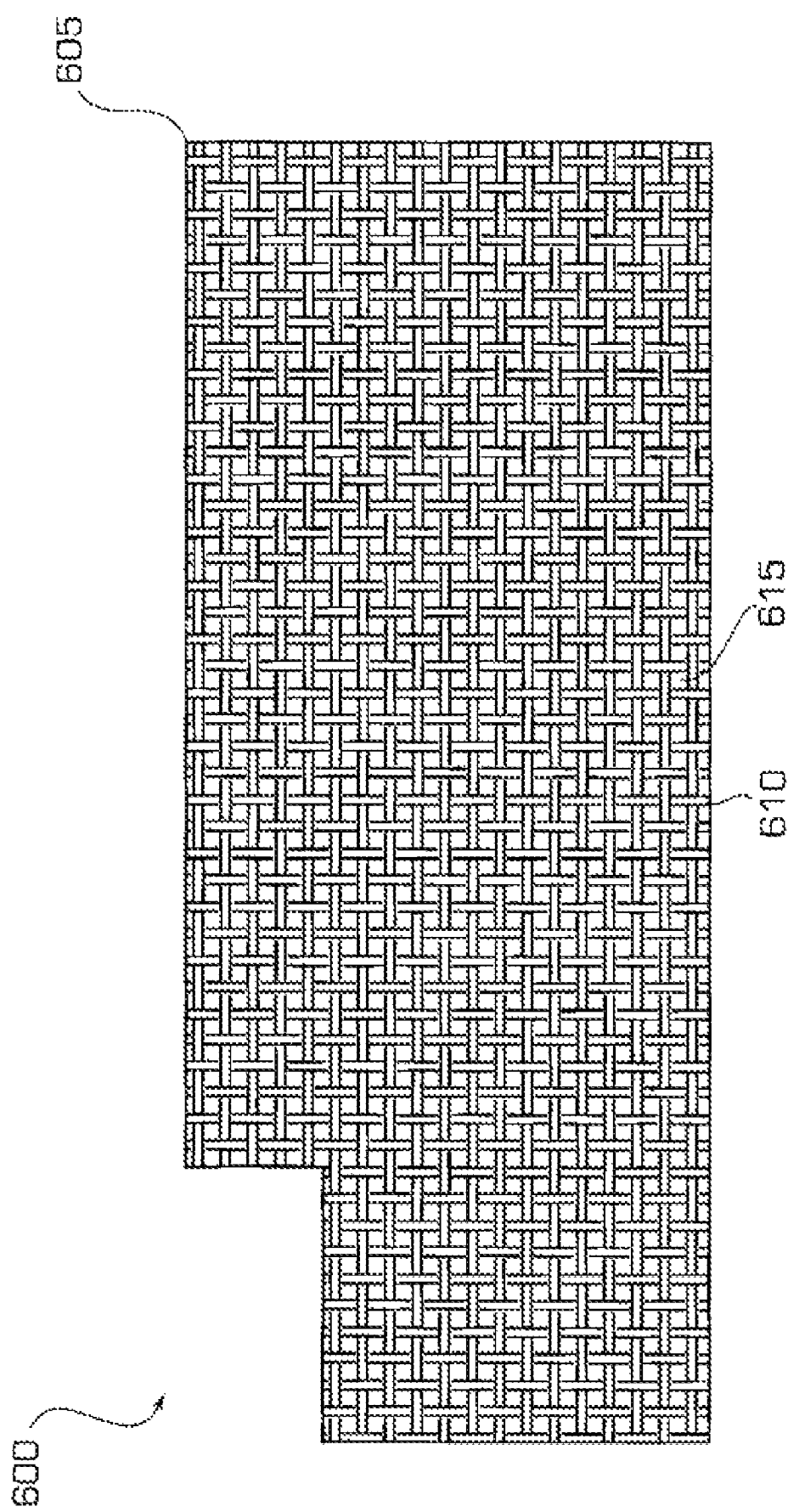
FIG. 6 is a top view of a wire mesh that may be placed on the bottom of the micro-enclosure, according to at least one embodiment.

Referring to FIG. 6, a top view of a wire mesh is shown. This mesh 605 may be placed on the bottom surface 410 of the well of the micro-enclosure 305, according to at least one embodiment. The mesh may be designed in a pattern such as a basket weave as shown, having wires 610 crisscrossed and weaved together, and voids between the weaved wire. The wire mesh 605 may be, for example, a gold plated copper mesh. The dimension of the weave may be, for example, 4-5 mils. The wire mesh 605 may have a geometry suited to fit within the micro-enclosure 305 well and have dimensions so as to lay flat on the bottom surface 410 of the well, at least in the area(s) where circuit devices may be mounted. The mesh may have a standoff distance from the walls 405 of the micro-enclosure 305 so that when a circuit element is attached or pressed into location, the wire mesh 605 does not get pinched between the wall 405 and the side of the circuit device. The wire mesh 605 may thus provide excellent ground and thermal conductivity, allow air underneath attached electrical devices to escape during vacuum conditions, and may absorb irregularities in the machining of the bottom surface of the micro-enclosure 305. As a result of using the wire mesh 605, the flatness requirement of the micro-enclosure 305 bottom surface 410 may be reduced. The use of the wire mesh 605 may also be used without adhesives and still attain the electrical and thermal conductivity needed during circuit element operation. Other possible means for improving thermal and electrical characteristics may include soldering the circuit to the housing or using indium foil as the interface layer. The use of mesh may be better in a number of ways. For example, because the solder process makes a rigid attachment, there may be problems with the electrical device cracking due to thermal coefficient of expansion (TCE) mismatches. For example, the use of indium may overcome this problem, but is difficult to rework, and does not allow for trapped air to escape unlike the mesh. In one variation, the wire mesh 605 may be a folded over sheet of wire that is stitched together at its ends.

Figure 7:
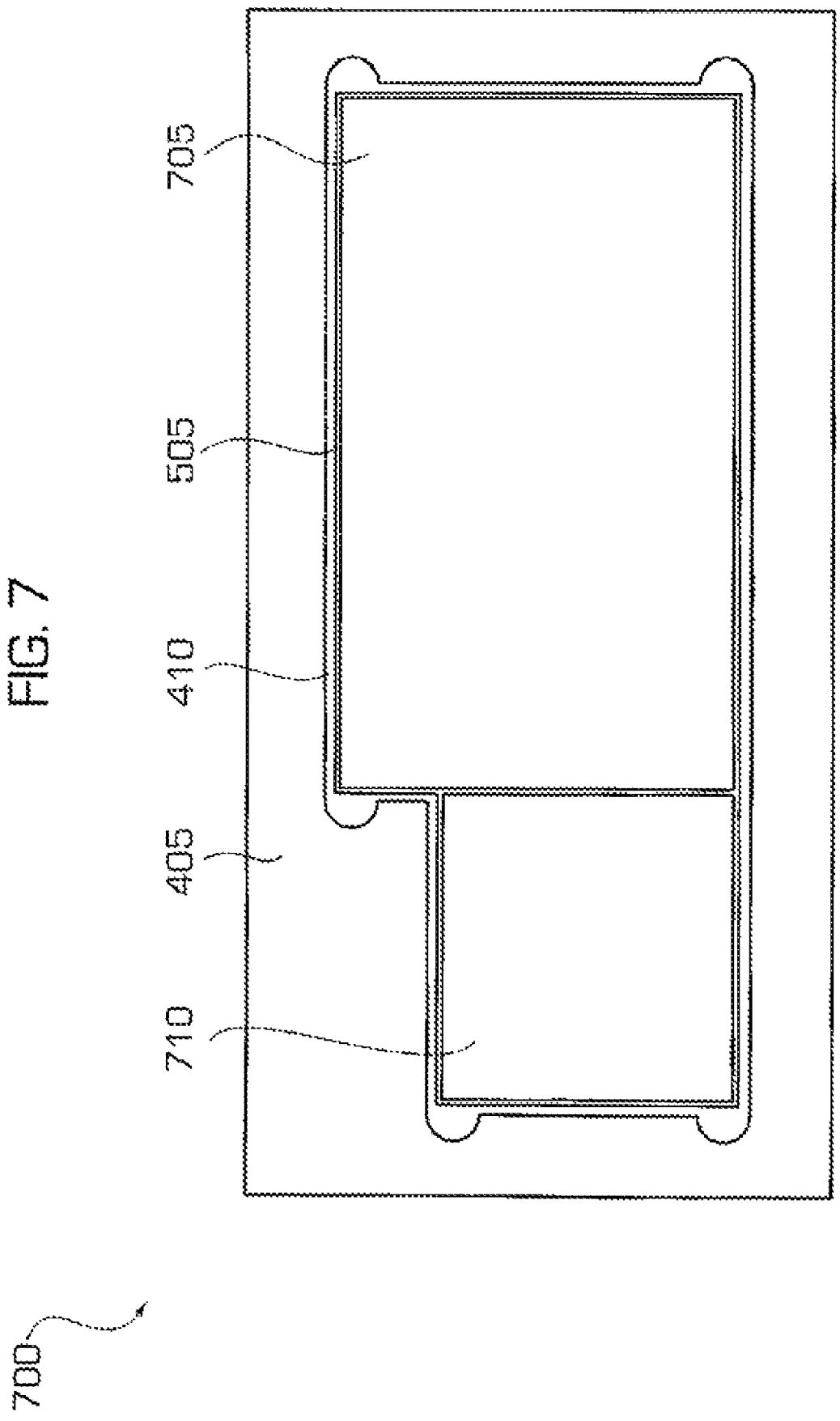
FIG. 7 is a top view of one of the micro-enclosures for housing one of more circuit elements that includes a plurality of circuit elements, according to at least one embodiment.

Referring now to FIG. 7, a top view 700 of one of the micro-enclosures 305 for housing one of more circuit elements is provided. In this embodiment, a micro-enclosure 305 is shown having two of circuit elements, circuit elements 705 and 710. Of course, a single circuit element or more than two circuit elements may be used in the well of the micro-enclosure. In any case, the circuit elements 705 and 710 may be, for example, superconductor devices, semiconductor devices, ceramic substrate devices such as hybrid modules, and/or various other types of electronic devices. The circuit elements 705 and 710 may be passive and/or active circuits. Preferably, the circuit devices 705 and 710 are planar circuit devices that have their bottom or back surfaces facing the bottom surface 410 of the micro-enclosure 305. Some exemplary circuit elements are shown in FIGS. 8 and 9.

Figure 8:
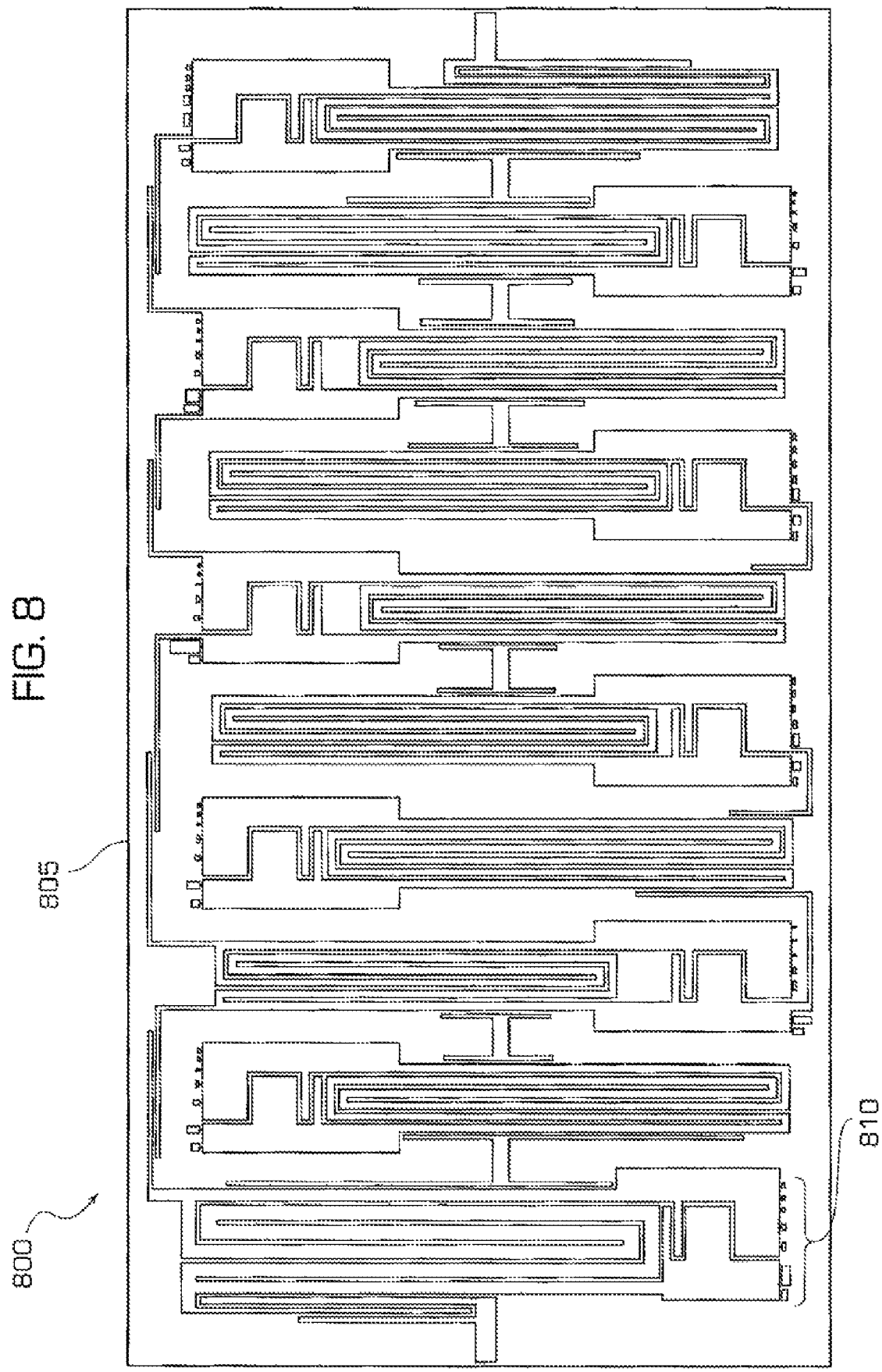
FIG. 8 is a top view of a planar microwave filter that may be housed in one of the micro-enclosures, according to at least one embodiment.

FIG. 8 shows a top view 800 of a planar microwave filter 805 that may be housed in one of the micro-enclosures 305, according to at least one embodiment. The microwave filter 805 may be, for example, a high temperature superconductor that must operate at very low temperatures of approximately 77K (e.g., cryocooled). The microwave filter may also have been pre-tuned using, for example, tuning tabs 810. As illustrated in FIG. 7, microwave filter 805 may be, for example, circuit device 705. U.S. patent application Ser. No. 11/289, 463 shows some methods of pre-tuning these filters, and is hereby incorporated for reference. These type of pre-tuning methods may help enable the use of clip-on lids (see FIG. 20) for the micro-enclosure since the lid thus does not need to be used as a mount for tuning screws.

Figure 9:
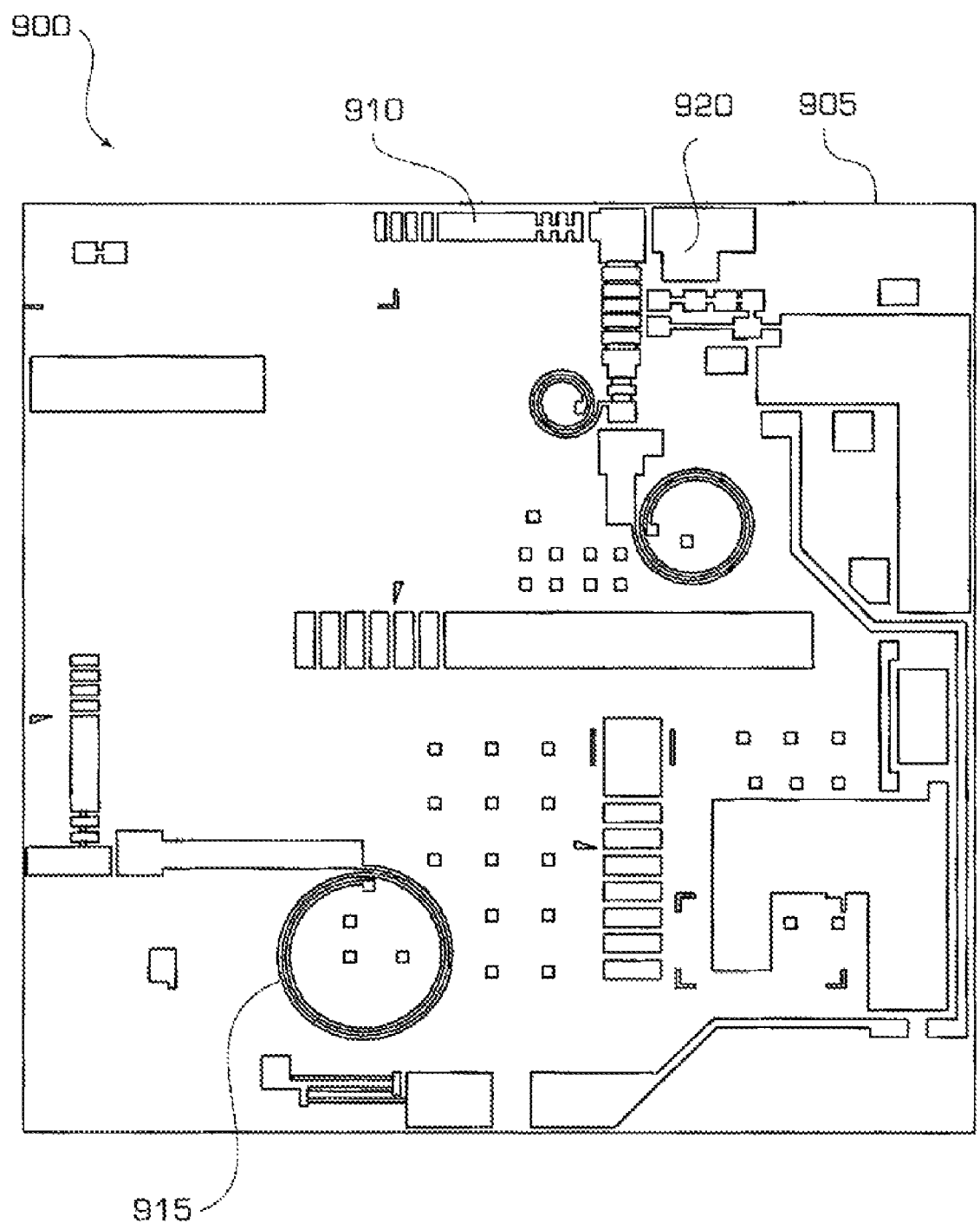
FIG. 9 is a top view of a low noise amplifier (LNA) planar hybrid circuit that may be housed in one of the micro-enclosures, according to at least one embodiment.

FIG. 9 shows a top view of an exemplary low noise amplifier (LNA) 900 that may be housed in one of the micro-enclosures 305 as, for example, circuit element 710, according to at least one embodiment. The LNA 900 may be a hybrid circuit or thick film circuit having, for example, a ceramic substrate or circuit board 905. The substrate 905 may be substantially planar, but would have some irregularities due to the technology. In that case, using the wire mesh 605 may prove particularly beneficial. The LNA 900 may include a circuit that has various incorporated or discrete components such as resistors 910 and coil elements 915, as well as metal traces 920 that may be used as, for example, bonding pads. The LNA 905 may be designed to operate as a cryocooled device.

Referring now to FIG. 10, a top view 1000 of one of the micro-enclosures 305 for housing one of more circuit elements is illustrated. Once the one or more circuit elements 705 and 710 are placed on the bottom surface 410 of the micro-enclosure 305 well, they need to be attached to the to one or more of the walls 405 or bottom surface 410 of the micro-enclosure 305 well. In one embodiment of the present invention, the circuit element 705 may be fastened to the micro-enclosure 305 using, for example, a plurality of clips 1005, 1010, 1015, and 1020. These clips may be, for example, a plurality of screw-less clips that are pushed into and snap into place to firmly hold down the circuit element 705 so that it makes good electrical and thermal contact with the bottom surface 410 of the micro-enclosure 305. This is particularly important when the circuit element 705 is an HTS filter. Further, the circuit element 710 may be attached to the housing or micro-enclosure 305 by clips 1025, 1020, 1035 and 1040. As will be described in more detail below, the clips 1005-1040 may be made of a resilient or spring material that can snap into holes or grooves within the housing wall of the micro-enclosure 305. Further, the clips may be inserted one, more than one, or all at a time because there are no screws to screw in and the clips may be snapped into place with pressure.

Referring now to FIG. 11, a view 1100 showing a cross-section of the walls and bottom surface 405 of one of the micro-enclosures 305 and circuit element 705 with a side view of a clip 1105 in the non-clipped position is illustrated, according to at least one embodiment of the present invention. The clip 1105 in this figure is resting on the corner of the circuit element 705 and is in a non-tension non-clipped position prior to being snapped into place. A notch 1115 may be provided in the side wall 405 of the micro-enclosure housing 305 to snap the clip into. The notch 1115 may be, for example, one of a plurality of notch holes or slots formed at locations in the wall where clips are to be place, or simply a groove formed around all or part of the periphery of the well so that the clips may be placed in numerous locations during assembly according to various performance characteristics. Although the notch is shown to have a side profile that is rectangular in shape, one skilled in the art will understand that the notch may have any one of a number of other profiles such as a triangle, curve, etc., or even be a ridge or bump that protrudes from the normal flat surface of the wall that is perpendicular the bottom or floor of well 405. Also, the clip may include a material 1110 that has elastic characteristic to interface between the clip 1105 and the circuit element 705 to keep that circuit element 705 from being damaged when the clip is engaged and snapped into place. The elastic material, 1110 may be, for example, plastic, rubber, Teflon, etc. In addition, the clip may be made of a resilient or material, for example, a spring metal, BeCu (Beryllium Copper), steel, etc., that will apply spring pressure to hold the circuit element 705 firmly in place. Of course, the clip 1105 may be made of a material that is both resilient and elastic so that a cover over the end abutting the circuit element 705 is not necessary. When force is applied to the top of the clip 1105 in the direction shown by arrow 1120, the lower end of the clip 1110 will apply pressure to push the top of clip 1105 into the notch 1115 and also force the bottom of clip 1105 down and outward toward the edge of the circuit element 705, as illustrated in FIG. 12.

Referring to FIG. 12, a view 1200 including a cross-sectional view of one of the micro-enclosures 405 and a circuit element 705, with a side view of a clip 1205, according to at least one embodiment. The clip 1205 in this illustration is in the clipped or snapped-in position, according to at least one embodiment. Again, the clip 1205 may be a screw-less clip and may be of resilient material that will provide spring tension to the clip 1205 when in the snapped-in position. The top of clip 1205 is embedded in the corner 1215 of the notch 1115. Also, the clip 1205 may be placed in continuous tension as indicated by the bend 1220 being more compressed and the end of the clip 1210 (with elastic material on it) bowed up approximately parallel to or slightly away from the top surface of the circuit element. In this position, clip 1205 will hold circuit element 705 firmly within the micro-enclosure 305 and toward the bottom surface of the micro-enclosure 305 (with or without a wire mesh 605 or other means 505 interspersed between the bottom of the micro-enclosure 405 and the circuit element 705).

After the circuit elements 705 and 710 have been firmly attached using the clips 1005-1040, the circuit elements 705 and 710 will need to be coupled to a interconnection cable means for getting power to the circuit elements 705 and/or 710 and/or data or communication signals to and from the circuit elements 705 and 710. The present invention cable carries multiple signals on a single cable. Prior to the present invention, typically the DC electrical power or bias was provide with one cable and each input and/or output signal (e.g., AC signal such as an RF signal for wireless communication) was provided with their own cables. However, in the present case a single cable has been developed that can provide both the capability to handle the DC bias signal and the AC communication signals, such as an RF signal. This is different from, for example, a tower mounted amplifier bias scheme in cellular communication systems because multiple channels may be powered from a single cable. In addition, in some applications the cable is capable of carrying additional signals, for example, sensor signals. Each cable has the capability of carrying multiple sensor signals, that may be for different sensors. The sensor signals may include, for example, temperature, power, or pressure.

Figure 13:
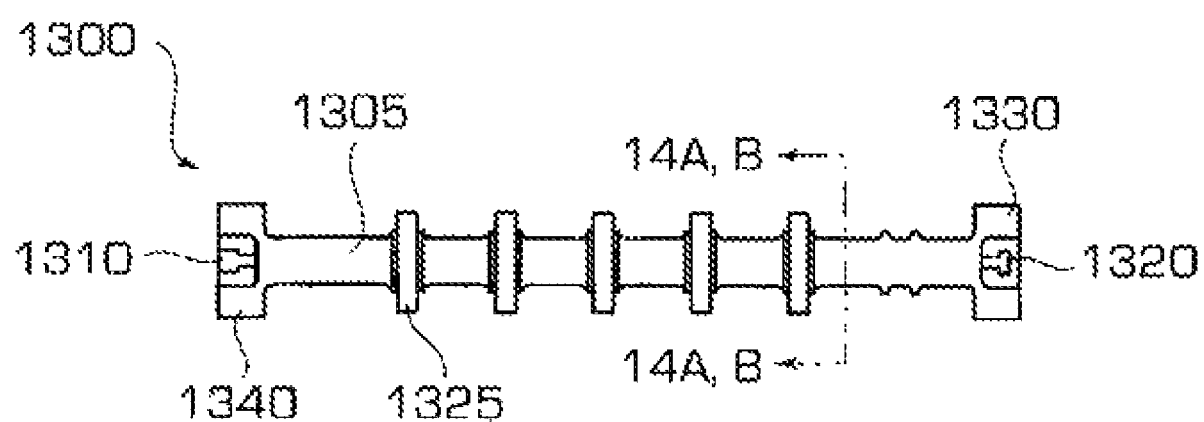
FIG. 13 is a top view of a cryocable without an isolating sleeve sheath, according to at least one embodiment.

Referring now to FIG. 13, a top view 1300 of a portion of a intercommunication cable 1305 is provided, without an insulating and shielding sleeve that will be described later. This cable may be referred to as a dielectrically loaded microstrip cable. The cable 1305 has a first end 1330 having conductive pad 1320 for electrically connecting to a circuit element (e.g., 705) and a second end 1340 having a clip 1310 for connection with a through pin in the top wall 125 of the dewar 100. The cable 1305 may also include spacers 1325 that will hold an outer insulating and shielding sleeve a set distance from the internal cable 1305. The spacers 1325 may be made from an insulating material such as nylon. Although four rings 1325 are shown, more or less spacers 1325 may be used. In at least one embodiment, the cable may be a cryocable for use in low temperature systems such as an HTS filter system and the cryocable may have low electrical loss while achieving a high thermal resistance.

Figure 14B:
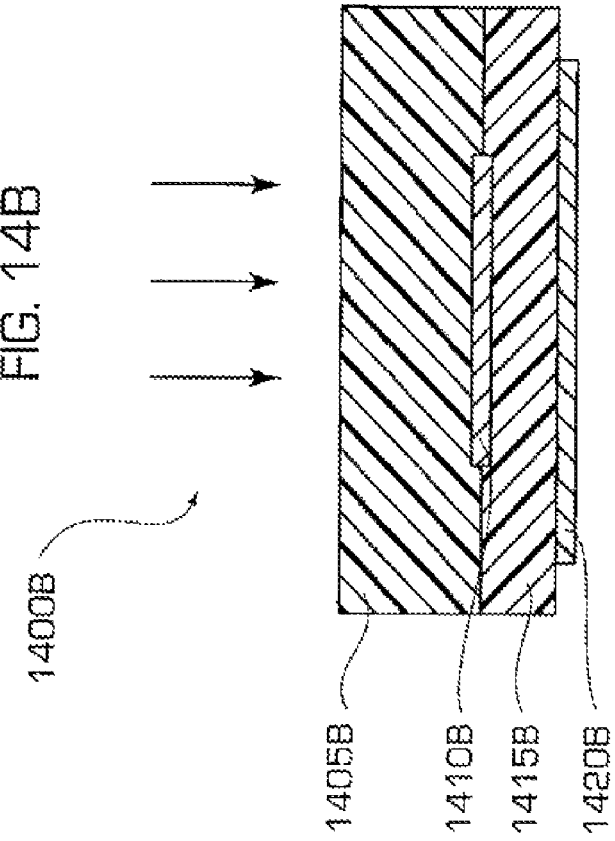
FIG. 14A and FIG. 14B are cross-sectional views of the cryocable, according to at least one embodiment.
Figure 14A:
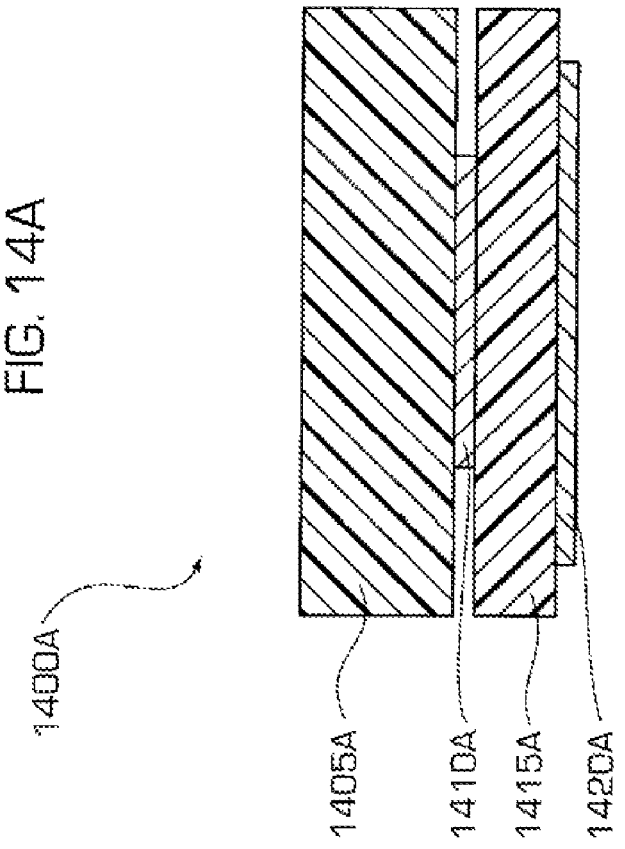

Referring now to FIG. 14A and FIG. 14B, cross-sectional views of the cable 1305 as taken along lines 14A, B in FIG. 13, show the cable before (14A) and after (14B) the cable is pressed together so that the center conductor 1410 is insulated by the upper insulating layer 1405 and lower insulating layer 1415, according to at least one embodiment. In FIG. 14A, the cable 1305 is shown as formed prior to compressing the insulation layers to encapsulate the main conductor 1410A. The main conductor 1410A may be formed on a first side of an insulation layer 1415A and covered on its top by insulation layer 1405A. A ground plane 1420A may be formed on the second side of insulating layer 1415A. Note that in this cross-section view 1400A, the insulation layers 1405A and 1415A do not completely surround the main conductor 1410A. FIG. 14B shows the cross-section 1400B of cable 1305 after the insulating layers 1405B and 1415B has been formed around the sides of main conductor 1410B. Some methods for forming the insulation layers around the main conductor 1410B may be, for example, by compression and/or heat. The insulation materials of the cable 1305 may be, and low loss RF material, such as epoxy-glass or kapton. Insulating layer 1405A and B may be, for example, approximately 10 mils thick and insulating layer 1415A and B may be, for example, approximately 5 mils thick. The main conductor 1410 A and B may be made of, for example, copper, aluminum, silver, or gold. The ground plane conductor 1420 A and B will be explained in more detail below.

Figure 15:
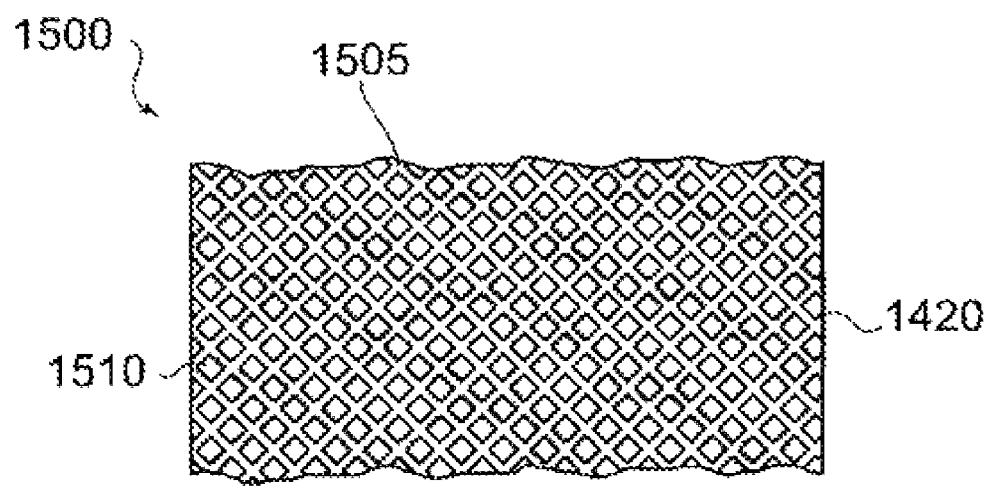
FIG. 15 is a bottom view of a mesh ground plane of the cryocable, according to at least one embodiment.

Referring now to FIG. 15, a section of a bottom view 1500 of the ground plane 1420 for the cable 1305 is illustrated, according to at least one embodiment. As shown, the bottom view of the ground plane 1420 shows a mesh pattern of the ground conductor material 1505 and interlaced voids 1510. The ground conductor may be made of a metal material, for example, copper, aluminum, silver, gold, tungsten, etc. Meshing the ground plane 1420 allows for a high thermal resistance while still maintaining a good electrical ground because of low electrical loss. The thickness of the ground plane metal can vary widely depending on the choice of materials. Once the cable 1305 is formed as shown in FIGS. 13-15, an isolating sleeve sheath may be added to provide shielding.

Figure 16:
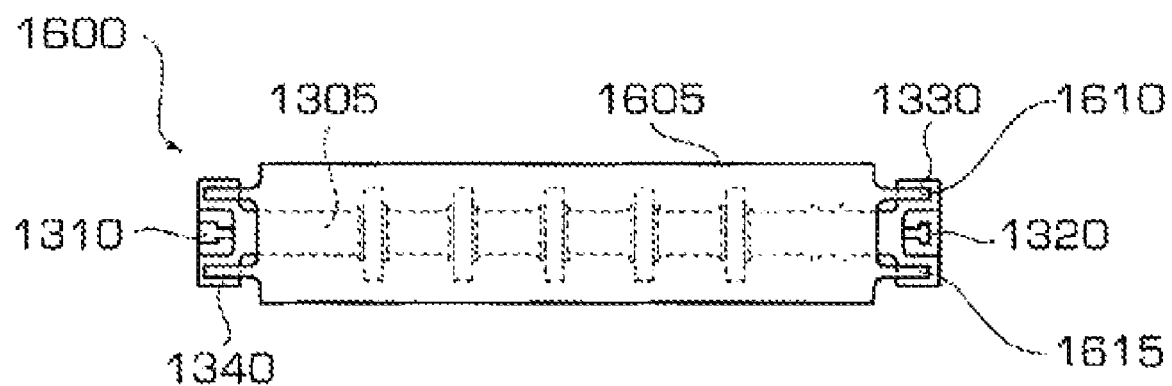
FIG. 16 is a top view of the cryocable with an isolating sleeve sheath, according to at least one embodiment.

FIG. 16 illustrates a top view 1600 (e.g., cryocable assembly including isolating sleeve sheath) of the cable 1305 with a isolating sleeve sheath 1605, according to at least one embodiment. The isolating sleeve sheath may provide both thermal and electrical shielding to the cable 1305. The isolating sleeve may have may be made of a flexible and insulating material such as plastic, rubber, polyester, fiber, Mylar, etc., to provide the heat and electrical insulating. The isolating sleeve may have conductive properties to provide the electric shielding. For example, the flexible and insulating material may be coated, interlaced, or lined with a conductive material, such as metals of gold, copper, aluminum, etc. On both ends, the isolating sleeve sheath 1605 may include a pair of "rabbit ears" 1610 and 1615 of the isolating sleeve material that extends to cover either side of the cable 1305 ends 1330 and 1340. These "rabbit ears" 1610 and 1615 may then be connected to a grounding plane on either end of the cable 1305 when the cable 1305 is connected to an electronic device and/or housing. The isolating sleeve sheath 1605 may completely surround the cable 1305 as a sleeve. The spacer rings 1325 provide a consistent distance between the cable 1305 and the isolating sleeve sheath 1605 so that the isolating sleeve sheath 1605 acts like the outer conductor of a coaxial type cable. Thus, the cable 1305 operates electrically like a coaxial cable having lower cost and better thermal resistance properties, making it a high performance, high thermal resistance RF cable with low cost. Further, the cable 1305 may be particularly useful for cryogenic.

Figure 17A:
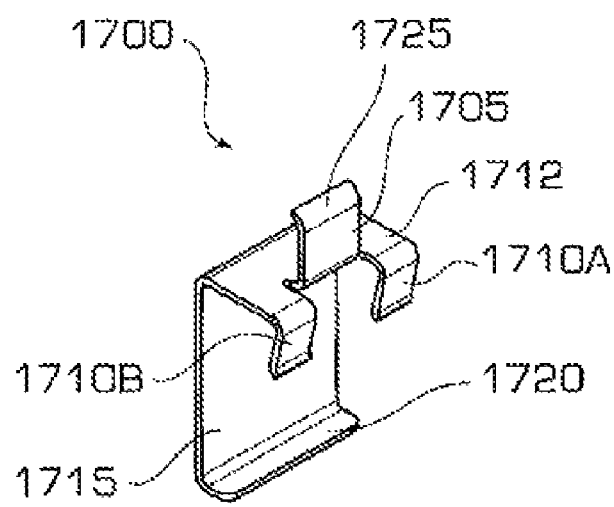
FIG. 17A is a perspective view of a screw-less clip for holding one end of the cryocable to a side of the micro-enclosure, according to at least one embodiment.
Figure 17B:
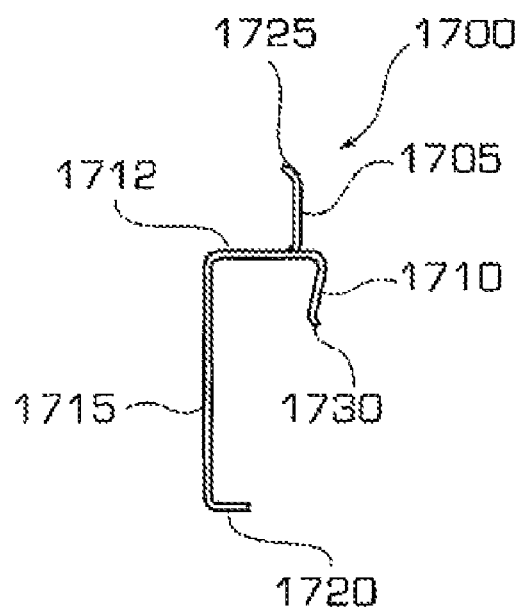
FIG. 17B is a side view of a screw-less clip for holding one end of the cryocable to a side of the micro-enclosure, according to at least one embodiment.
Figure 18:
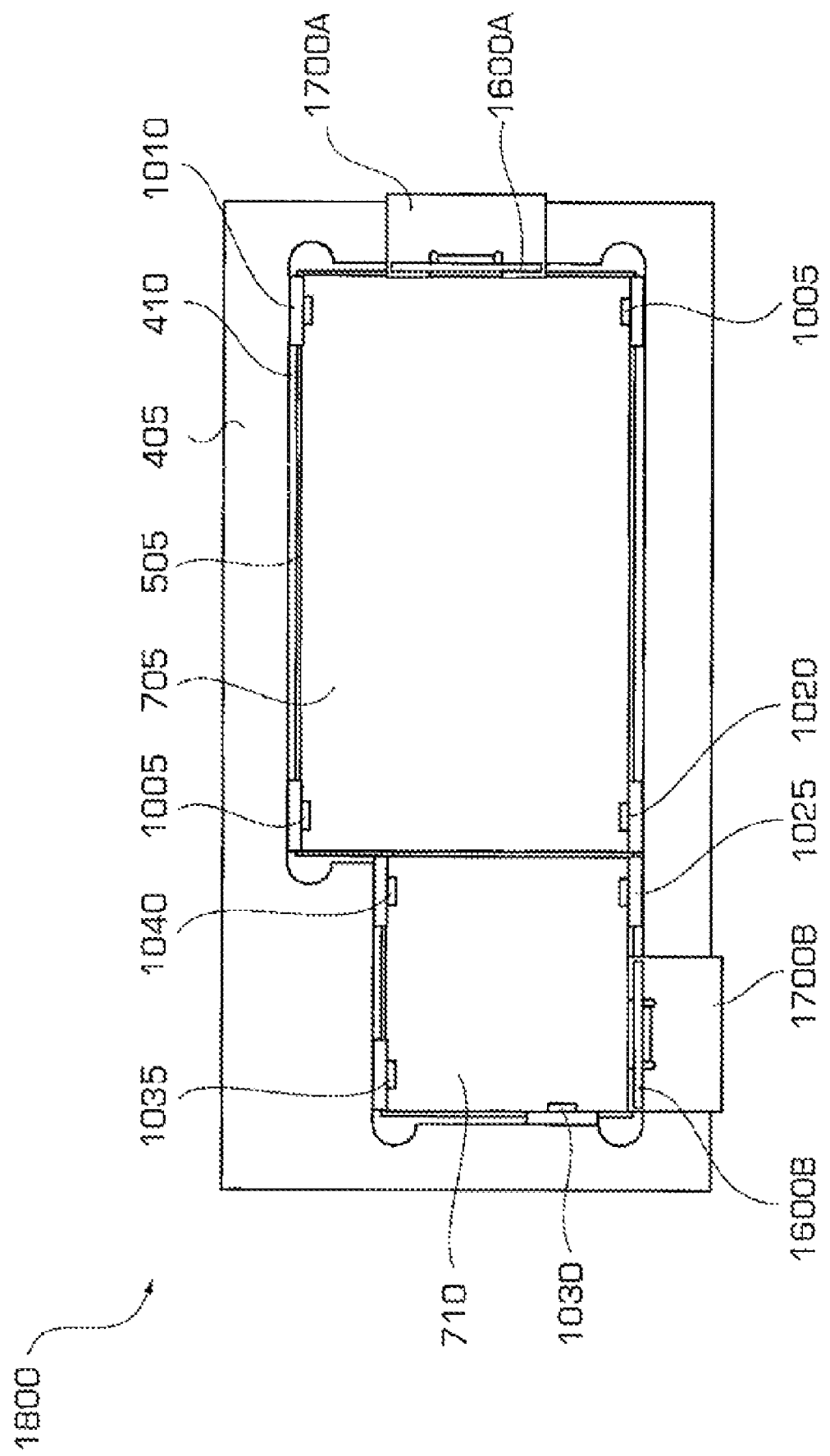
FIG. 18 is a top view of one of the micro-enclosures for housing one or more circuit elements that includes a plurality of screw-less clips to hold the cryocables, according to at least one embodiment.

Referring now to FIGS. 17A and 17B, a perspective view and a side view of a clip 1700 for holding one end of the cable 1305 with isolating sleeve sheath 1605 is shown, according to at least one embodiment. Clip 1700 may be a screw-less clip that attaches to the outer portion of the side wall 405 of a micro-enclosure 305. As such, the "C" shaped sides 1710, 1712, 1715, and 1720 span four sides (inside well wall, outside top of well wall, outside side wall of micro-enclosure housing, and the bottom outside wall of the micro-enclosure housing) of a micro-enclosure 305 well and outer housing. The slight bend inward of the side 1710 into the C shape may provide the spring tension to keep the clip 1700 attached after it is snapped in place. The clip 1700 may be made of a resilient material such as spring metal, BeCu, steel, etc., that can provide spring tension so as to stay in place when attached and to clamp certain items in place. This clip 1700 may be used to hold end 1330 of cable 1305 in place and maintain a good ground for the isolating sleeve sheath 1605. For example, when the clip 1700 is snapped into place, tabs 1710A and 1710B with their end portion 1730 may grasp either side of the T shape on end 1330 of cable 1305 and rabbit ears 1610 and 1615 of the isolating sleeve sheath 1605. In this way, clip 1700 may hold the cable 1305 in place so that an electrical connection may be made to electric pad 1320 after the cable 1305 is installed in place and may also operate as a ground connection for the isolating sleeve sheath 1605. When the clip is in the installed position on the outside of the side wall 405 of a micro-enclosure, tab 1705 and bent ridge 1725 may act as a guide, rest and tension release for the cable 1305 and isolating sleeve sheath 1605. FIG. 18 shows a top view 1800 including a plurality of clips 1700A and 1700B snapped into place and holding the cables 1600A and 1600B to one of the micro-enclosure 405 for housing one of more circuit elements 705 and 710 that includes, according to at least one embodiment.

Figure 19A:
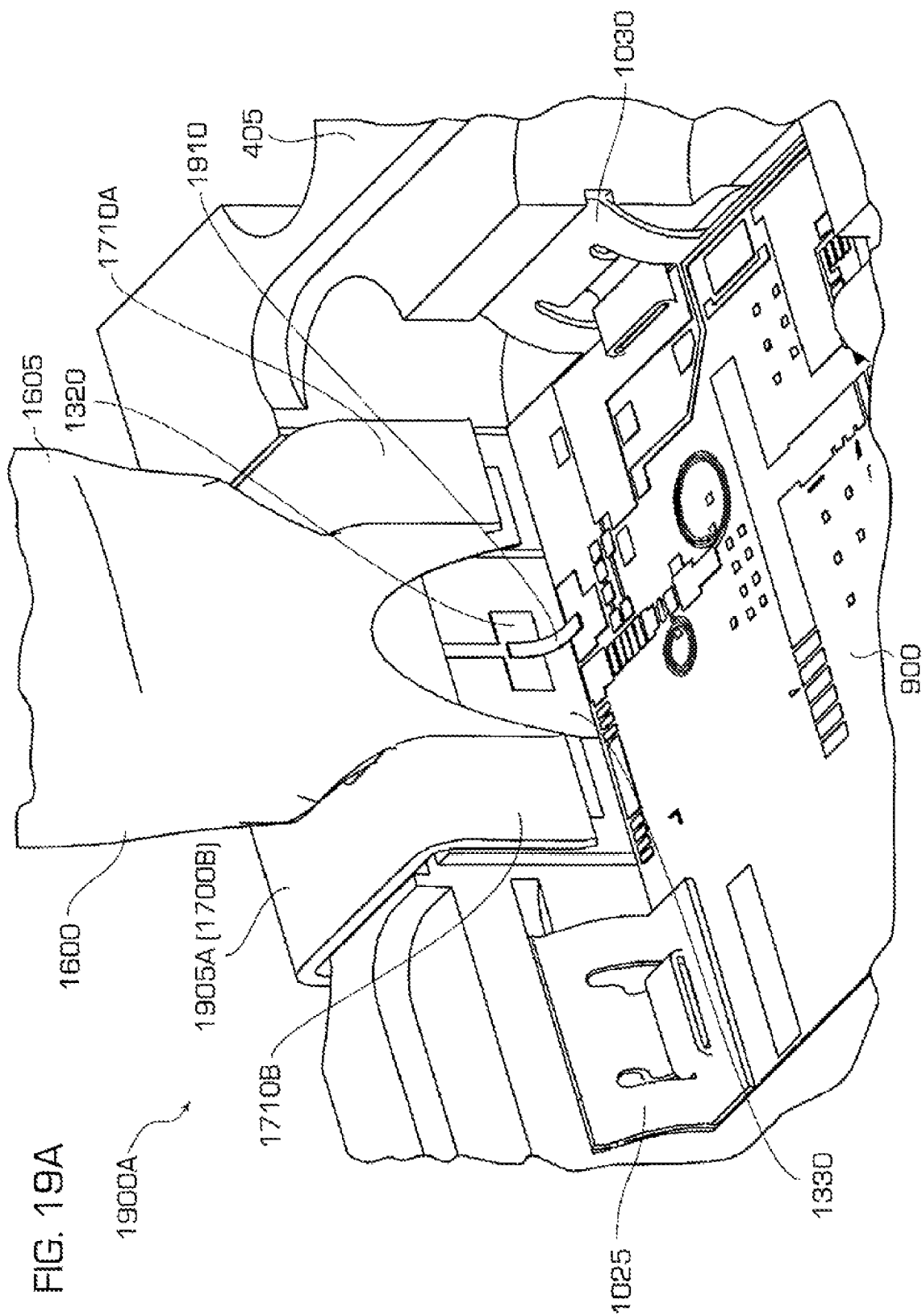
FIG. 19A is a partial sectional perspective view of a micro-enclosure with an LNA clipped in and a cryocable attached to the side of the housing and connected to the LNA, according to at least one embodiment.
Figure 19B:
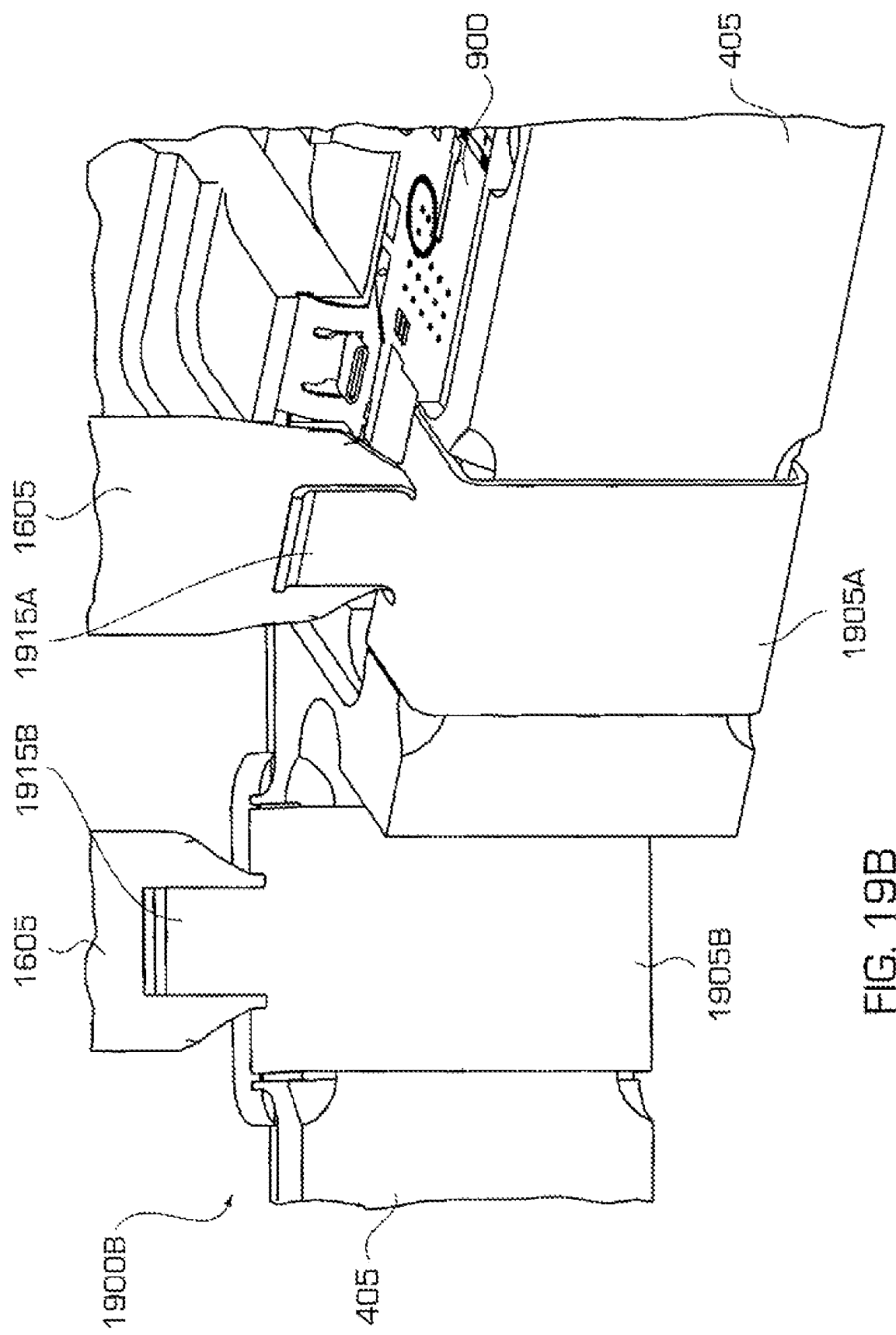
FIG. 19B is a partial sectional perspective view looking from the outside of a micro-enclosure with a cryocable attached to the side of the housing using a screw-less clip, according to at least one embodiment.

FIGS. 19A and 19B show more clearly how the clips 1905 (1700) are attached to the micro-enclosure housing and hold the cable 1600. FIG. 19A is a partial sectional perspective view 1900A of a micro-enclosure 305 with, for example, an LNA 900 clipped into the well and a cable 1600 with isolating sleeve sheath 1605, for example a cryocable, attached to the side of the housing 405 and connected to the LNA 900 with, for example, a ribbon weld 1910, according to at least one embodiment. As described earlier, the clip tabs 1710A and 1710B grasp the sides of end 1330 and the rabbit ears 1610 and 1615 firmly and hold them into place. The isolating sleeve sheath 1605 also is squeezed between the tabs 1710A and 1710B so that it can not move from side to side. This clip approach provides a quick, easy and secure installation of the cable 1600. Once the cable 1600 is clipped into place on the inside wall of the micro-enclosure housing 405, a ribbon weld 1910 may be put into place to electrically connect a bonding pad on the electronic circuit, in this case LNA 900, to the cables main conductor 1410 via pad 1320. Note that clips 1025 and 1030 are snapped into place and holding down the LNA 900 into the well.

FIG. 19B provides another perspective of the cable 1600 and attachment clip 1700. FIG. 19B shows a partial sectional perspective view 1900B looking from the outside of a micro-enclosure 305 with a cable 1600 (isolating sleeve sheath 1605) attached to the side of the housing 405 using, for example, a screw-less attachment clip 1905A and 1905B, according to at least one embodiment. As previously mentioned, tabs 1915A and 1915B help support the cable 1600 and its isolating sleeve sheath 1605.

Referring now to FIG. 20, a top view 2000 of one of the micro-enclosures 305 for housing one of more circuit elements 705, 710 that includes a lid 2005, according to at least one embodiment. Once the cable(s) 1600 have been attached and electrically connected to the electronic devices 705, 710 a lid or plate 2005 may be placed on top of the micro-enclosure 305 well so as to cover everything in the well and overlap with a portion of the wall 405. In various embodiments, the lid 2005 may be made of a conductive material, for example a metal, for electric isolation and shielding of the electronic circuits contained in the cavity of the micro-enclosure 305. For example, the lid 2005 may be made of a thin BeCu material. As mentioned earlier, this type of lid is particularly useful when used in conjunction with the filter pre-tuning mention earlier. The lid 2005 does not need to be particularly well dimensioned and may be formed at low cost by, for example, stamping. Note that the lid is designed to fit around the cable attachment clips 1700A and 1700B and the cables 1600A and 1600B. The housing walls 405 may be recessed on the top so that the lid may be quickly placed on the micro-enclosure 305 well and the lid will self align by setting down into the recessed locations on the top of the walls. In various embodiments, the underside of the lid 2005 may include alignment tabs to help the lid 2005 to snap into the walls of the micro-enclosure 305. The lid 2005 may also include one or more grooves or bumps (not shown) to assist in securing the lid 2005 to the micro-enclosure 305 well, as will be described in more detail in reference to FIGS. 21 and 22.

Figure 21:
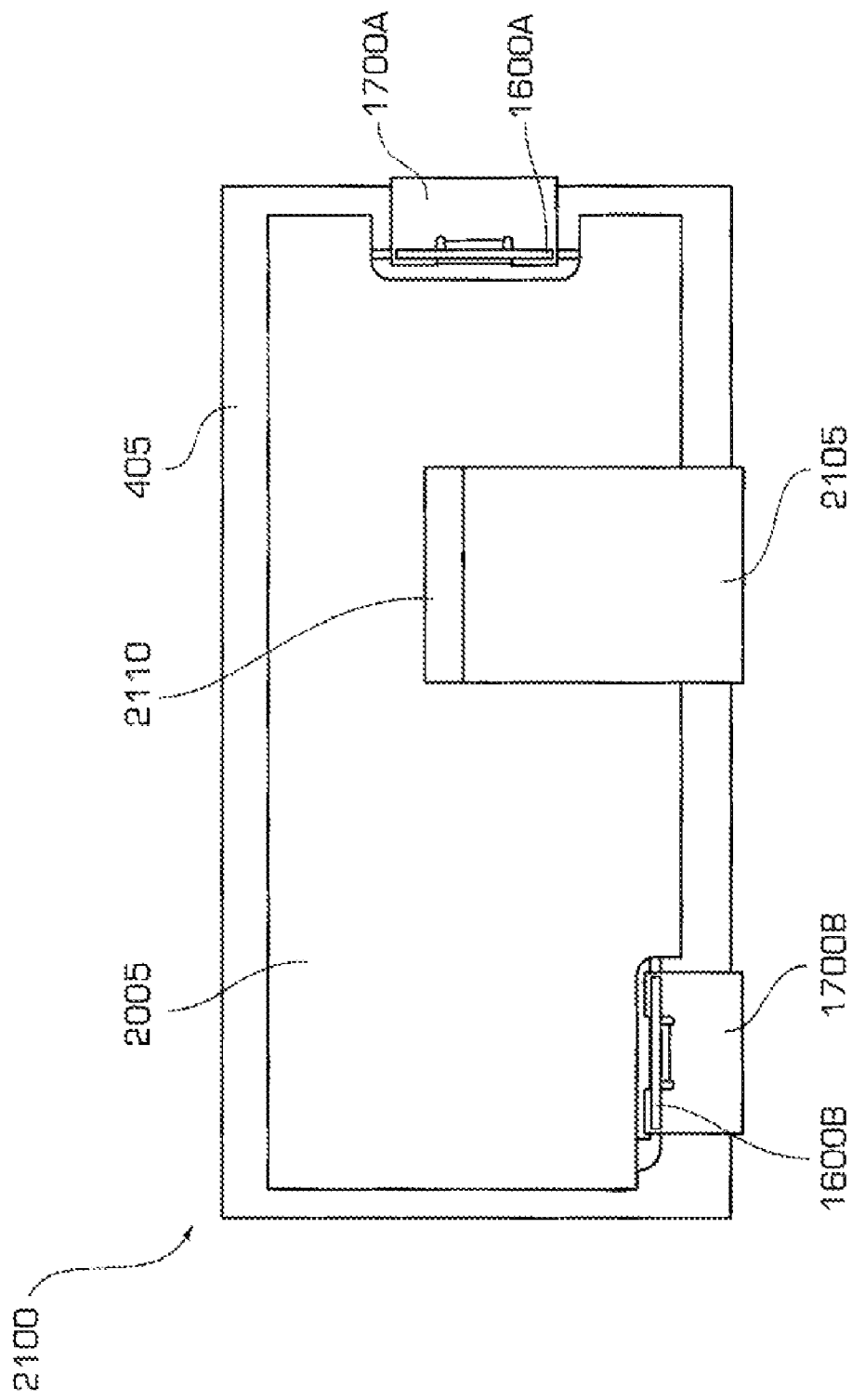
FIG. 21 is a top view of one of the micro-enclosures for housing one of more circuit elements that includes a lid and a screw-less clip holding the lid on the micro-enclosure, according to at least one embodiment.

FIG. 21 is a top view 2100 of one of the micro-enclosures 305 for housing one of more circuit elements that includes a lid 2005 and a clip 2105 holding the lid 2005 on the micro-enclosure 305, according to at least one embodiment. As shown in this top view, the clip 2105 may be placed across a portion of the lid 2005 to apply downward pressure to hold the lid 2005 to the micro-enclosure 305 walls 405. The clip 2105 may be made of a resilient material, for example, a spring metal, spring steel, BeCu, etc. Also illustrated is a portion 2110 of the clip 2105 that may be provided to help secure the clip 2105 in a particular place on the lid 2005 and help keep the lid 2005 from moving from its location relative to the walls 405. In various embodiments portion 2110 may be have a convex curvature in the direction of the lid 2005 and may snap into or link up with an indention or valley in the top of the lid 2005. In some embodiments, the portion could mate up with one or more ridges in the top of the lid 2005. In any case, portion 2110 may help better secure the lid 2005, clip 2105 and housing wall 405 together. Further, the clip 2105 may be held in place by a ridge or valley formed in the underside of the micro-enclosure housing (not shown here, see FIG. 2).

Figure 22:
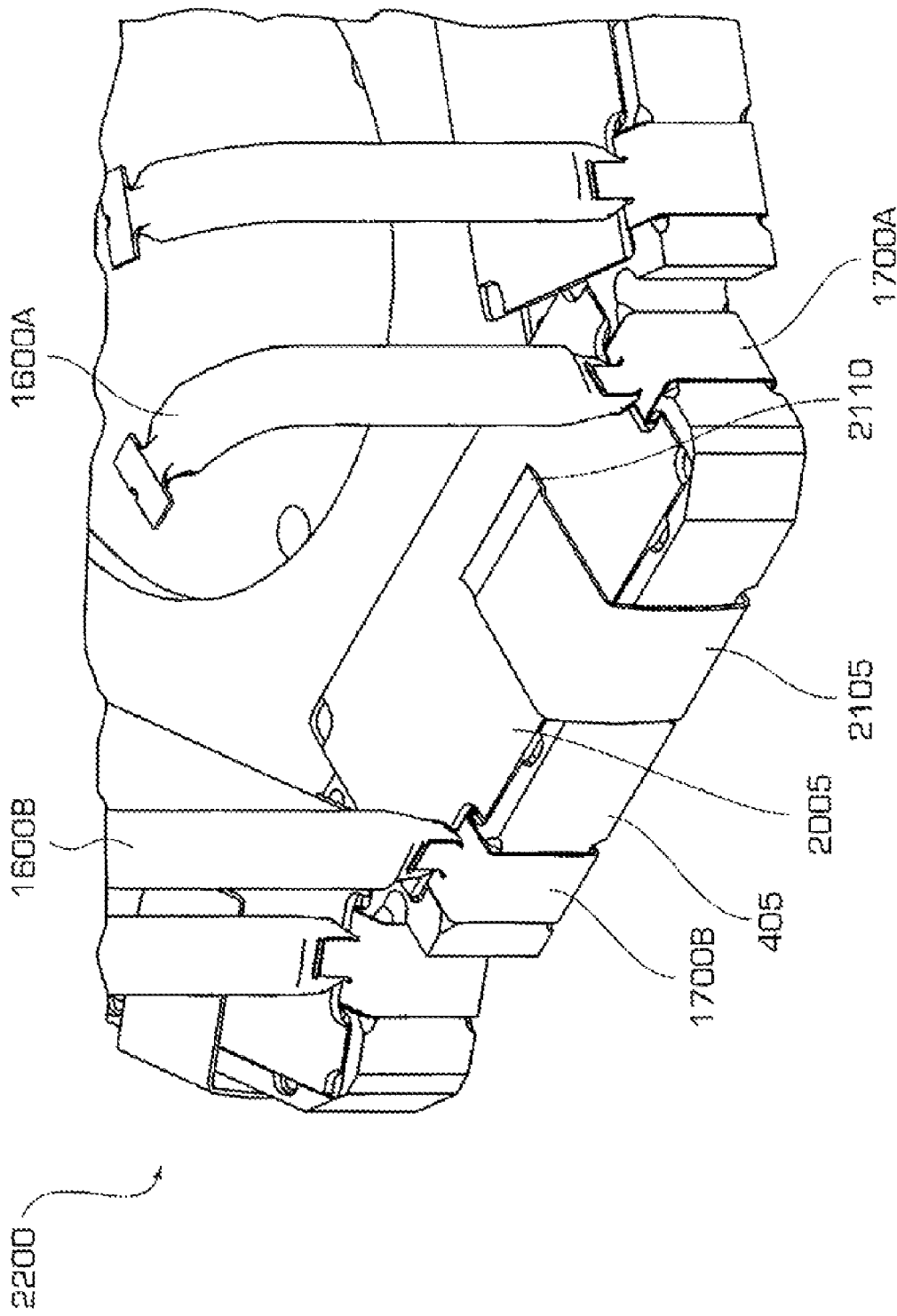
FIG. 22 is a partial sectional perspective view looking at the outside of a micro-enclosure with a cryocable attached to the side of the housing using a screw-less clip and a lid enclosing the top of the micro-enclosure that is held on by a screw-less clip, according to at least one embodiment.

Referring to FIG. 22, a partial sectional perspective view 2200 including a lid clip 2105. This view is looking at the outside of a micro-enclosure 305 with, for example, cryocables 1600A, 1600B attached to the sides of the housing 405 using clips 1700A, 1700B, and a lid 2005 is provided enclosing the top of the micro-enclosure 305 that may be held on by, for example, a screw-less clip 2105, according to at least one embodiment. Once again, portion 2110 is shown having a convex curvature downward toward the top surface of lid 2005 to better secure the lid 2005. As can be seen, the clip 2105 may be quickly slid over the lid 2005 and the outside of the micro-enclosure housing wall 405 to complete the enclosure. Once each of the micro-enclosures 305 of the micro-enclosure plate 300 have been completed, the other end of the cables 1600 (1305) will need to be attached to through electrodes of the dewar top wall 125 and securely attached to the inside surface of the dewar top wall 125, as will be described referring to FIGS. 23-27.

Figure 23:
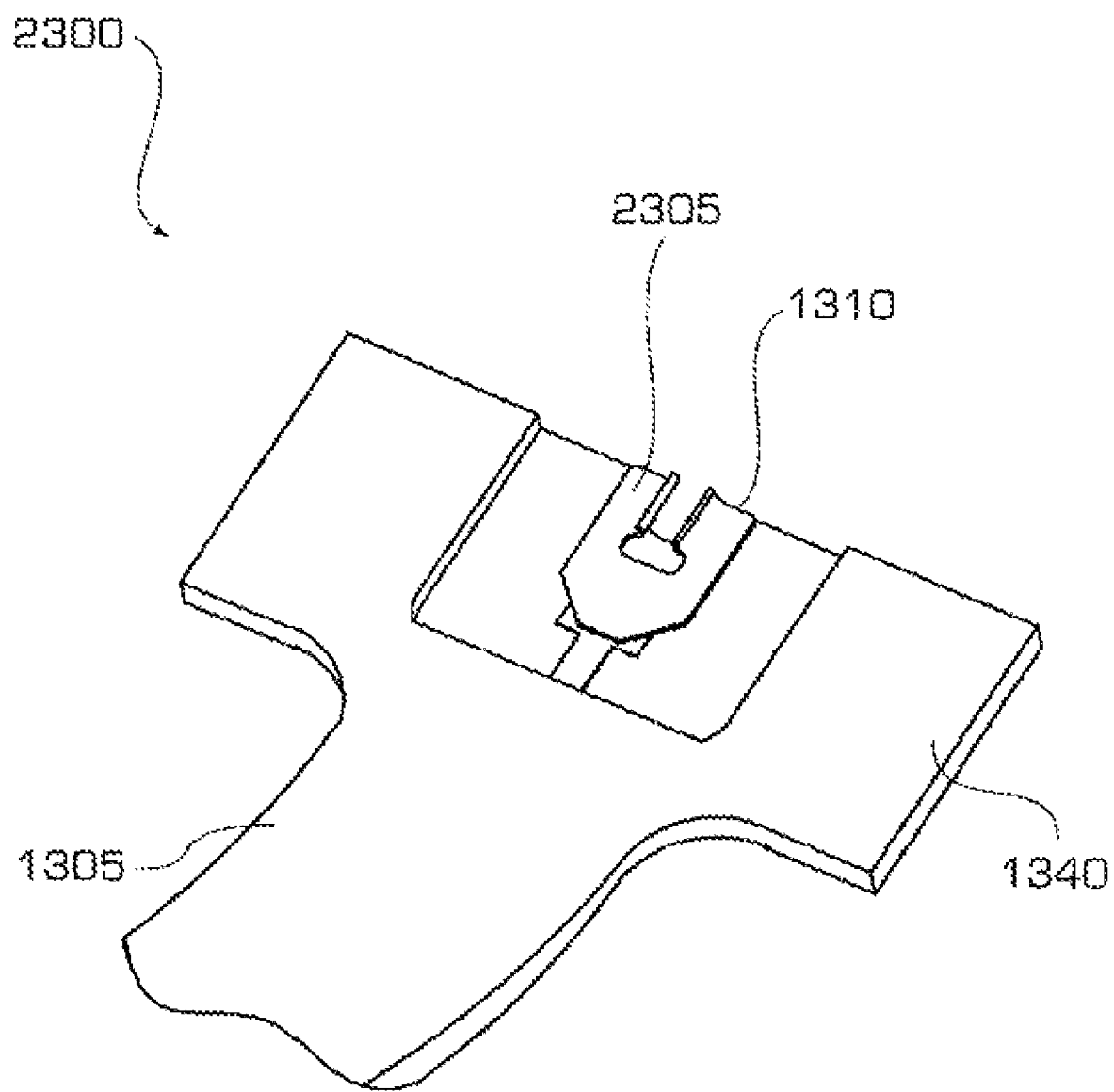
FIG. 23 is a partial sectional perspective view of a portion of the cryocable that is outside the micro-enclosure and the end of the cryocable that couples the electronic devices inside the micro-enclosure to some other circuitry outside the micro-enclosure, according to at least one embodiment.

Referring now to FIG. 23, a partial sectional perspective view 2300 of a portion of the cable 1305, for example a cryocable, that is outside the micro-enclosure 305 and end 1340 of the cable 1305 that couples the electronic devices inside the micro-enclosure 305 to some other circuitry (e.g., a receiver section of a wireless base station), according to at least one embodiment. The cable end 1340 includes an electrical conductor end 1310 with a clip 2305 connected to it by, for example, soldering. The clip 2305 is design to have a slot and curved portions for quick connection to a pin or terminal that provides the electrical through path from the inside to the outside of the dewar 100. The clip 2305 may be made of a resilient material, for example, a spring metal, spring steel, BeCu, etc. As describe below, the clip 2305 must be designed for quick connection and so that it had good electrical connection to the through-pin.

Figure 24:
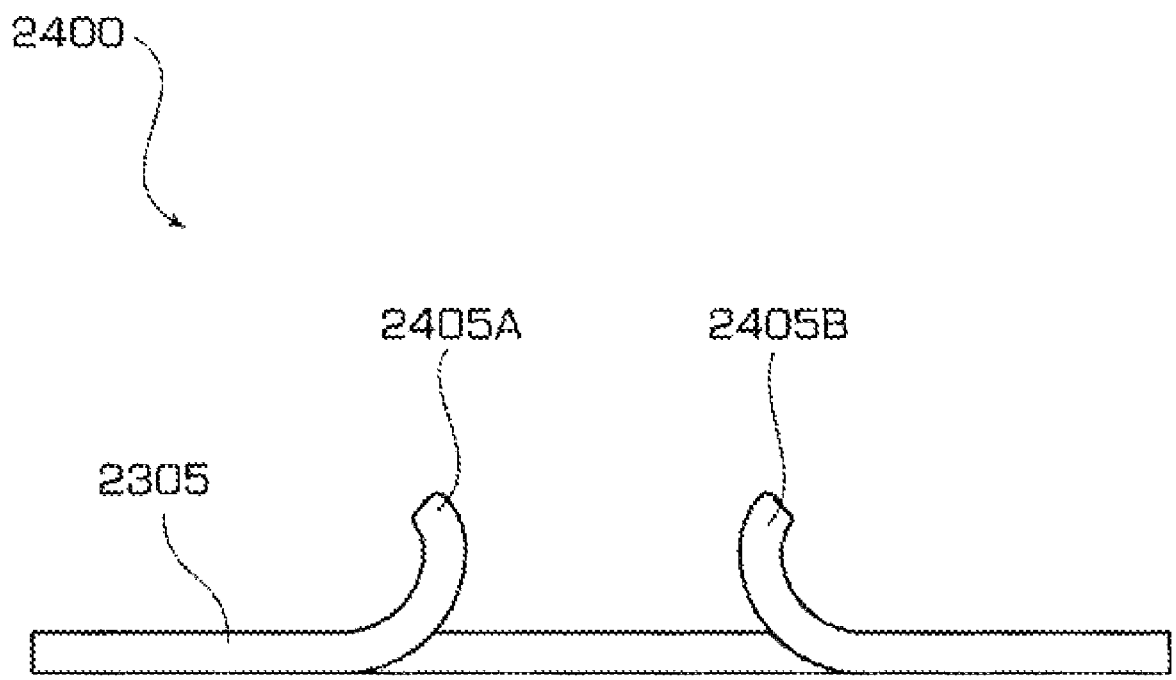
FIG. 24 is an end view of a spring clip on one end of the cryocable that attaches to a through pin of the dewar casing lid plate, according to at least one embodiment.

Referring to FIG. 24, an end view 2400 of the clip 2305 on one end of the cable 1305 that attaches to a through pin of the dewar top wall 125 (casing lid plate), according to at least one embodiment. To enable a quick connection, there are two parallel curved portions 2405A and 2405B that are shaped to easily be pushed on a pin or terminal while spreading to accommodate the full width of the pin or terminal. Once attached, spring tension from the curved portions 2405A and 2405B will help make good electrical contact, and in the case of an RF signal help insure there is little RF loss.

Figure 25:
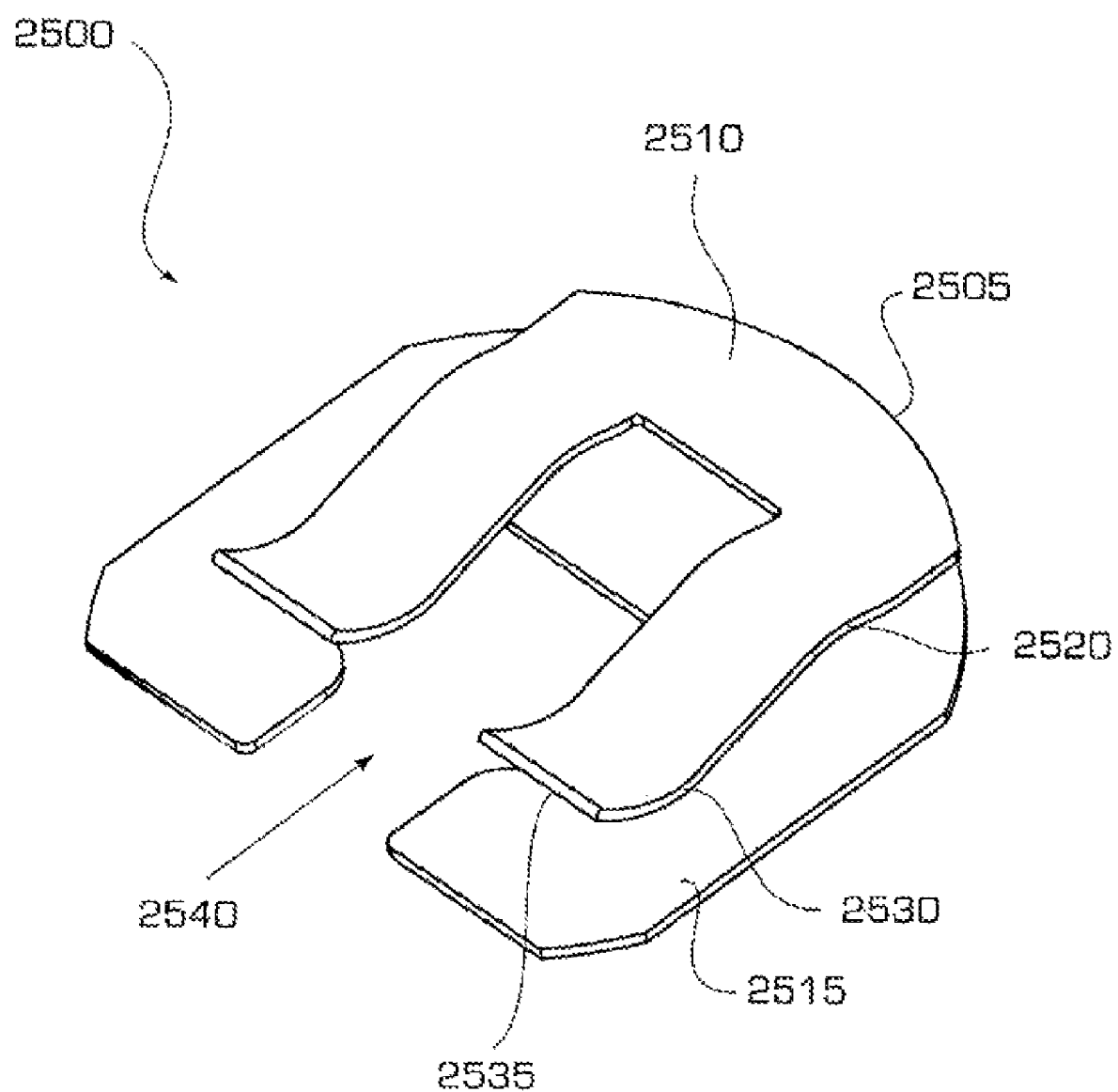
FIG. 25 is a perspective view of a retainer clip that holds the cryocable spring clip and isolating sleeve sheath to the lid of the dewar, according to at least one embodiment.
Figure 26:
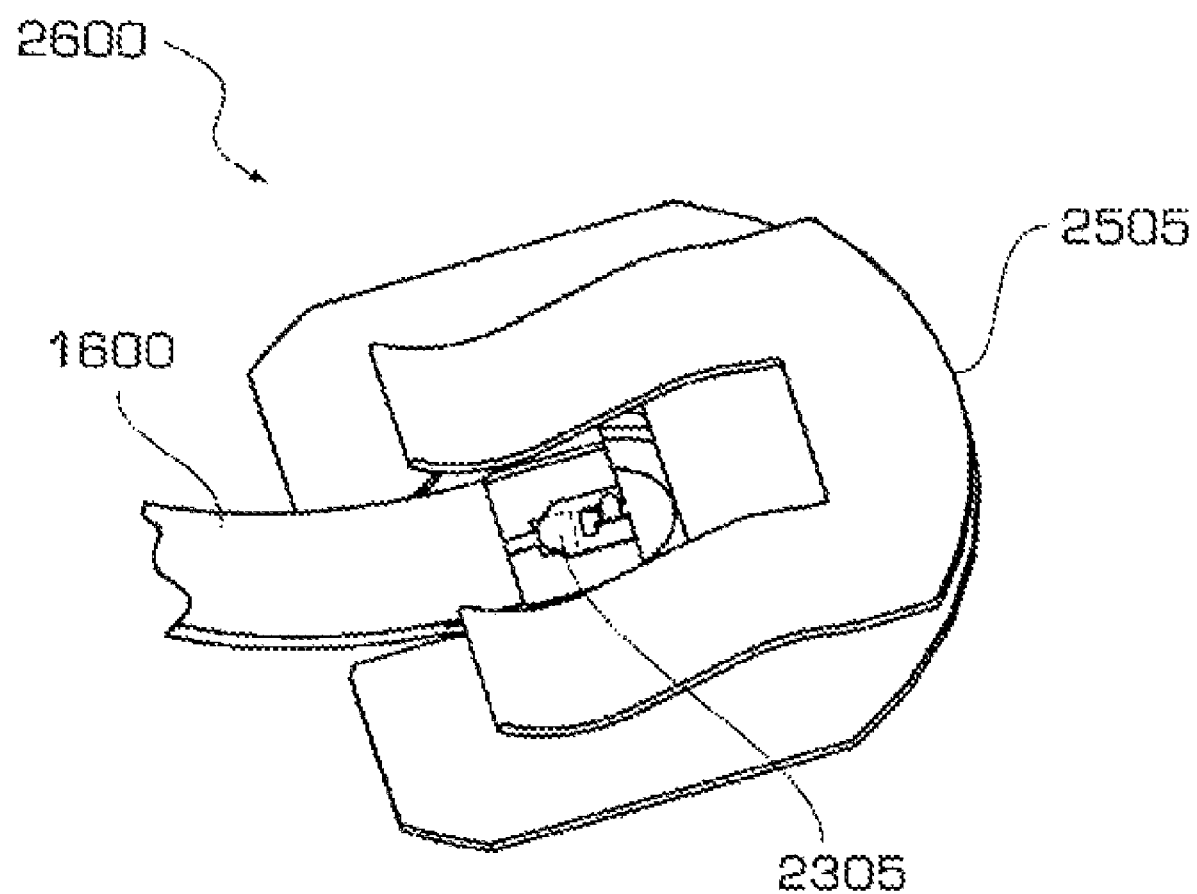
FIG. 26 is a perspective view of the retainer clip holding the cryocable spring clip and isolating sleeve sheath, according to at least one embodiment.

Referring now to FIG. 25, a cable end retainer clip 2505 is provided. This retainer clip may be used to ensure that cable 1305 and clip 2305 does not move off of the through post or terminal and provide good grounding connection for the isolating sleeve sheath 1605. The clip 2505 may be made of a resilient material, for example, a spring metal, spring steel, BeCu, etc. The retainer clip 2500 may be securely mounted to the inside of the dewar top wall 125. From this perspective view 2500 of the retainer clip 2505 it can be seen to have a top portion 2510 with slightly curved fingers 2530 bent slightly downward and bend 2520 and a bottom portion 2515 that may hold the cable spring clip 2305 in place by placing tension on the T portions of cable end 1340 and grasp the rabbit ears of the isolating sleeve sheath 1605. The fingers 2530 may have a slight curve upward at their ends to make ease of insertion when pushing in the end 1340 of the cable 1305 into the retainer clip via direction 2540. The bottom portion 2515 may include female type cut out shape to accommodate the T shape of the cable end 1340, so as to lock the cable end 1340 into place so that it will not become disconnected during the rest of assembly, shipping, or operation. The bottom portion 2515 may be firmly attached to the inside of the lid or top wall 125 of the dewar. FIG. 26 shows a perspective view 2600 of the retainer clip 2505 mated to cable spring clip 2305 and holding the cable 1600 with isolating sleeve sheath.

Figure 27:
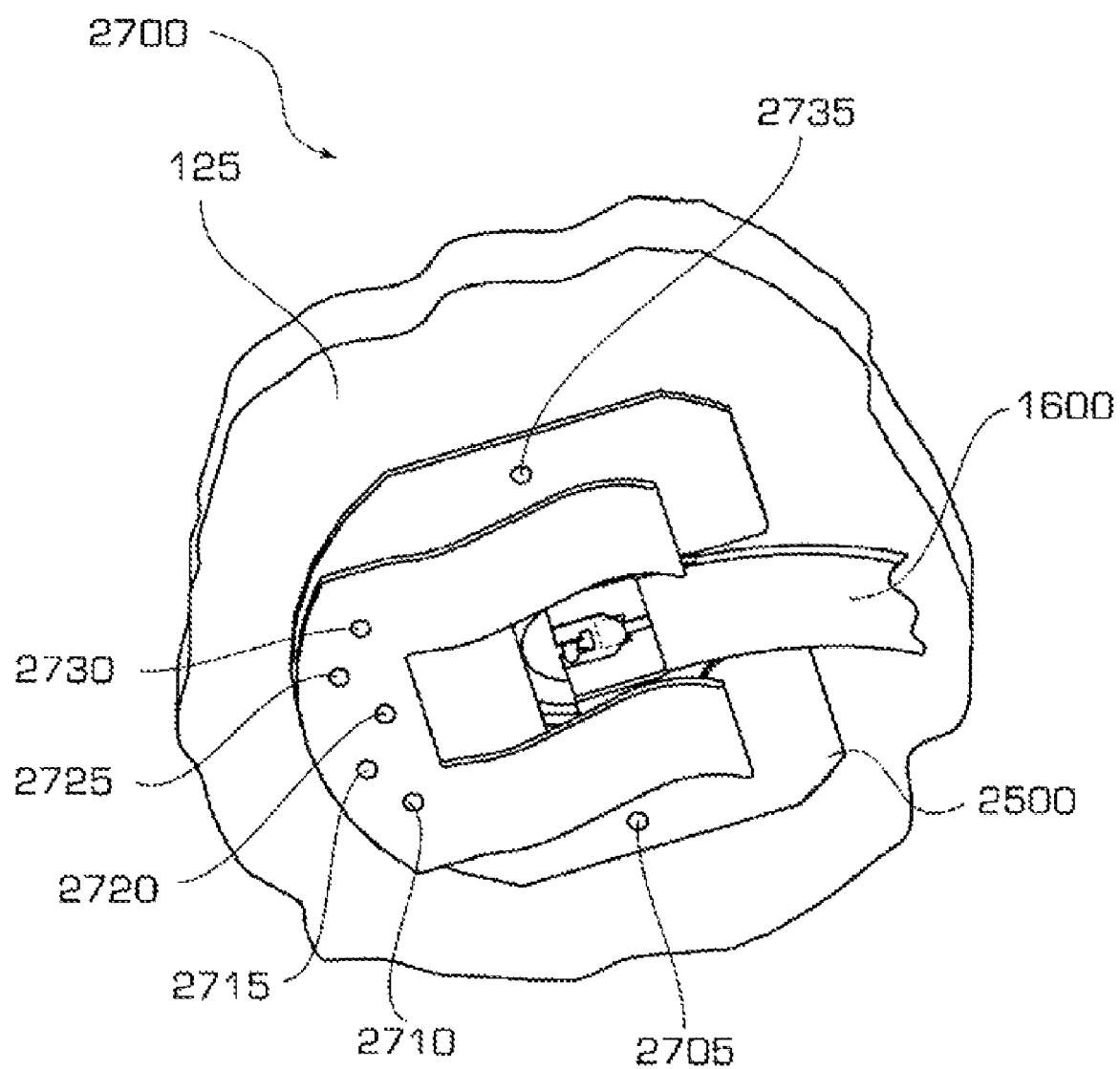
FIG. 27 is a partial sectional perspective view of the retainer clip holding the cryocable spring clip and isolating sleeve sheath to the lid of the dewar, with the retainer clip welded to the lid of the dewar, according to at least one embodiment.

Referring to FIG. 27, a partial sectional perspective view 2700 of the retainer clip 2505 holding the cable spring clip 2305 and cable with isolating sleeve sheath 1600 to the inside surface of the lid or top wall 125 of the dewar 100, with the retainer clip 2505 welded to the lid 125 of the dewar 100, according to at least one embodiment. The retainer clip 2505 may be attached to the top wall 125 of the dewar by any means that will firmly secure it so that it can support the weight of the cable 1600 and which provides for good electrical contact between the top wall 2005 and the retainer clip 2505 for the grounding of the grounding plane in the cable 1305 and the grounding of the isolating sleeve sheath 1605. In various embodiments, that means may be by screws, welding, etc. In the case of welding the retainer clip 2505 may be, for example, spot welded to the top wall 125 using a plurality of spot welds 2705-2735. Note that in this particular case, more spot weld were formed on the portion of the retainer clip 2505 where the top portion 2510 and the bottom portion 2515 overlap.

As described herein, the present invention includes a number of means and methods for simplifying the assembly and reducing the cost of packaging electronic devices. Although various embodiments shown herein are directed to cryogenic systems that may include a dewar, superconductor filter, and/or LNA typically found in base station designs for wireless communication, these techniques are equally useful for other applications. The are particularly useful for any RF or microwave systems or systems where the electronic devices are exposed to a vacuum (e.g., outer space applications). Further, many applications involving housing electronic devices may also benefit from the use of the snap in connectors and related assembly methods described herein. Finally, many applications that typically use coaxial cables or need to reduce the number of cables in an electronic system may benefit from the cable designs and assembly methods described herein.

While embodiments of the invention have been described above, it is evident that many alternatives, modifications and variations will be apparent to those skilled in the art. For example, other types of material could be considered for the screw-less clips described herein. In applications that do not require electrical contact be provided through the clip, a rubber or plastic material may prove useful and help reduce cost and weight. Accordingly, the embodiments of the invention, as set forth above, are intended to be illustrative, and should not be construed as limitations on the scope of the invention. Various changes may be made without departing from the spirit and scope of the invention. Accordingly, the scope of the present invention should be determined not by the embodiments illustrated above, but by the claims appended hereto and their legal equivalents.

We claim:

1. An electronic signal processing system, comprising:
   a shielding enclosure;
   a substantially planar circuit element enclosed within the shielding enclosure;
   one or more of conductive cables; and
   a plurality of spring clip styles that mechanically holds together the shielding enclosure, planar circuit and the one or more conductive cables into a microelectronic subassembly, wherein the plurality of spring clip styles includes one or more first style clip(s) that mechanically snaps to a portion of the shielding enclosure and secures the planar circuit element to the shielding enclosure, one or more second style clip(s) that mechanically snaps into position to hold two sections of the shielding enclosure together, and one or more third style clips(s) into position and constrains one or more conductive cables to the shielding enclosure.

2. The system of claim 1, wherein the two sections of the shielding enclosure includes:
   a cavity having a floor and walls approximately perpendicular to the floor; and
   a lid for capping the cavity.

3. The system of claim 2, further comprising:
   a conducting interface layer covering the floor of the cavity.

4. The system of claim 3, wherein the conducting interface layer is a metal mesh.

5. The system of claim 1, wherein the substantially planar circuit element includes two separate circuit assemblies, one being a filter and one being an LNA, each held in the shielding enclosure with a plurality of the one or more first style clip(s).

6. The system of claim 1, further comprising a cryocooled housing, and wherein the shielding enclosure is disposed inside the cryocooled housing.

7. The system of claim 1, further comprising a cryocooled housing that is cooled to a temperature of approximately 77K and wherein the substantially planar circuit element is an HTS filter.

8. The system of claim 1, wherein the plurality of spring clip styles, includes one or more fourth style clip(s) that attach one or more conductive cables to a connector coupling assembly.

9. The system of claim 8, wherein the plurality of spring clip styles includes one or more fifth style clip(s) that attach and retains the one or more fourth style clips so that the one or more conductive cables remain coupled to a connector coupling assembly and a wall of a subassembly housing.

10. The system of claim 1, wherein the spring clips are screw-less clips.

11. The system of claim 1, wherein the conductive cables are planar cables that are a dielectrically loaded micro-strip or strip-line.

12. The system of claim 1, wherein one or more of the conductive cables carry on a single line two or more signals selected from the group consisting of a bias signal, an RE signal, and a temperature sensor signal.

13. The system of claim 1, wherein one or more of the conductive cables includes a meshed ground plane.

14. The system of claim 1, wherein one or more of the conductive cables includes a isolating sleeve for shielding.

15. An electronic signal processing system, comprising:
   a cryocooling housing;
   a micro-enclosure disposed inside the cryocooling housing;
   a filter and a low noise amplifier housed within the micro-enclosure;
   a plurality of cables;
   at least one screw-less clip(s) that mechanically attaches together at least one of the filter, the low noise amplifier, or the cables to the micro-enclosure.

16. The system of claim 15, wherein the micro-enclosure includes:
   a cavity having a floor and walls approximately perpendicular to the floor; and
   a lid for capping the cavity, wherein the cryocooled housing is cooled to a temperature of approximately 77K.

17. The system of claim 15, wherein the at least one screw-less clip(s) includes one or more first spring clips) that mechanically snaps to a portion of the micro-enclosure and secures the filter or the low noise amplifier to the micro-enclosure.

18. The system of claim 17, wherein the at least one screw-less clip(s) includes one or more second spring-clip(s) that mechanically snaps into position to hold the lid to the cavity.

19. The system of claim 18, wherein the at least one screw-less clip(s) includes one or more third clip(s) that mechanically snaps into position and constrains one or more cables to the micro-enclosure.

20. The system of claim 19, wherein the at least one screw-less clip(s) includes one or more fourth clip(s) that attach one or more cables to a connector coupling assembly.

21. The system of claim 20, wherein at least one screw-less clip(s) includes one or more fifth clip(s) that retains one of the fourth clips so that the one or more cables remain coupled to a connector coupling assembly and a wall of the cryocooling housing.

22. An electronic signal processing system, comprising:
   a subsystem housing;

a shielding enclosure disposed in the subsystem housing, the shielding enclosure including a cavity having a floor and walls approximately perpendicular to the floor and a lid for capping the cavity;

a conducting interface layer made from a metal plated wire mesh covering the floor of the cavity;

a first planar circuit element disposed on the conducting interface layer within the shielding enclosure;

a plurality of first screw-less spring clips that mechanically attaches the first planar circuit element to the shielding enclosure and pushes it onto the conducting interface layer;

a second planar circuit element disposed on the conducting interface layer within the shielding enclosure;

a plurality of second screw-less spring clips that mechanically attaches the second planar circuit element to the shielding enclosure and pushes it onto the conducting interface layer;

a first conductive cable coupled to the first planar circuit element;

a second conductive cable coupled to the second planar circuit element;

a plurality of third screw-less spring clips that mechanically attaches a first end of the first conductive cable and a first end of the second conductive cable to the shielding enclosure;

a plurality of fourth screw-less spring clips that mechanically attaches a second end of the first conductive cable and a second end of the second conductive cable to respective through posts that extend through a wall of the subsystem housing; and a plurality of fifth screw-less spring clips attached to the subsystem housing that mechanically retains the plurality of fourth screw-less spring clips that attaches the second end of the first conductive cable and the second end of the second conductive cable so that they remain connected to respective through posts that extend through a wall of the subsystem housing.

23. The system of claim 22, wherein the first planar circuit is an HTS filter.

24. The system of claim 22, wherein the second planar circuit is an LNA.

25. The system of claim 22, wherein the first conductive cable and the second conductive cable are cryocables and the subsystem housing is a dewar.

26. The system of claim 22, wherein the shielding enclosure is a heat sink and includes a plurality of separate shielding enclosures formed symmetrically around a center mounting section.

* * * * *

UNITED STATES PATENT AND TRADEMARK OFFICE
CERTIFICATE OF CORRECTION

PATENT NO. : 7,838,780 B2  
APPLICATION NO. : 11/459336  
DATED : November 23, 2010  
INVENTOR(S) : Edward R. Soares et al.

It is certified that error appears in the above-identified patent and that said Letters Patent is hereby corrected as shown below:

Col. 17, claim 1, line 51 insert --that mechanically snaps-- after "together, and one or more third style clip(s)"

Signed and Sealed this  
Tenth Day of May, 2011

David J. Kappos  
*Director of the United States Patent and Trademark Office*